United States Patent
Kim et al.

(10) Patent No.: US 12,035,627 B2
(45) Date of Patent: Jul. 9, 2024

(54) POWER GENERATION APPARATUS

(71) Applicant: LG INNOTEK CO., LTD., Seoul (KR)

(72) Inventors: Jung Ho Kim, Seoul (KR); Jeung Ook Park, Seoul (KR); Sang Hun An, Seoul (KR); Jong Min Lee, Seoul (KR); Ji Hwan Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 201 days.

(21) Appl. No.: 17/792,321

(22) PCT Filed: Jan. 11, 2021

(86) PCT No.: PCT/KR2021/000333
§ 371 (c)(1),
(2) Date: Jul. 12, 2022

(87) PCT Pub. No.: WO2021/145620
PCT Pub. Date: Jul. 22, 2021

(65) Prior Publication Data
US 2023/0075288 A1    Mar. 9, 2023

(30) Foreign Application Priority Data

Jan. 13, 2020 (KR) .................. 10-2020-0004473
Jan. 13, 2020 (KR) .................. 10-2020-0004475

(51) Int. Cl.
*H10N 10/17* (2023.01)
*H10N 10/13* (2023.01)
*H10N 10/81* (2023.01)

(52) U.S. Cl.
CPC ............. *H10N 10/17* (2023.02); *H10N 10/13* (2023.02); *H10N 10/81* (2023.02)

(58) Field of Classification Search
None
See application file for complete search history.

(56) References Cited

U.S. PATENT DOCUMENTS

| 2016/0035957 A1* | 2/2016 | Casey .................... H10N 10/13 136/230 |
| 2019/0024561 A1 | 1/2019 | Kim et al. |
| 2021/0234082 A1 | 7/2021 | Lee et al. |

FOREIGN PATENT DOCUMENTS

| GB | 2549121 A * | 10/2017 | .............. F01N 5/02 |
| JP | 2012-204752 A | 10/2012 | |
| KR | 10-2015-0132209 A | 11/2015 | |

(Continued)

*Primary Examiner* — Daniel P Malley, Jr.
(74) *Attorney, Agent, or Firm* — Birch, Stewart, Kolasch & Birch, LLP

(57) ABSTRACT

A power generation apparatus according to an embodiment of the present invention comprises: a cooling unit, a thermoelectric module comprising a thermoelectric element disposed on one surface of the cooling unit, and a heat sink disposed on the thermoelectric element; a guide plate disposed opposite the thermoelectric module; and a branch unit disposed on another surface perpendicular to the one surface of the cooling unit. The heat sink includes multiple heat dissipation fins which are spaced apart from each other. The ratio of the shortest horizontal distance between the heat sink and the guide plate to the shortest horizontal distance between the branch unit and the guide plate is 0.0625 to 0.25.

19 Claims, 18 Drawing Sheets

(56) References Cited

FOREIGN PATENT DOCUMENTS

| KR | 10-2017-0092276 A | 8/2017 |
| KR | 10-2018-0134070 A | 12/2018 |
| KR | 10-2019-0065763 A | 6/2019 |
| WO | WO 2007/026432 A1 | 3/2007 |

* cited by examiner

[FIG. 1]
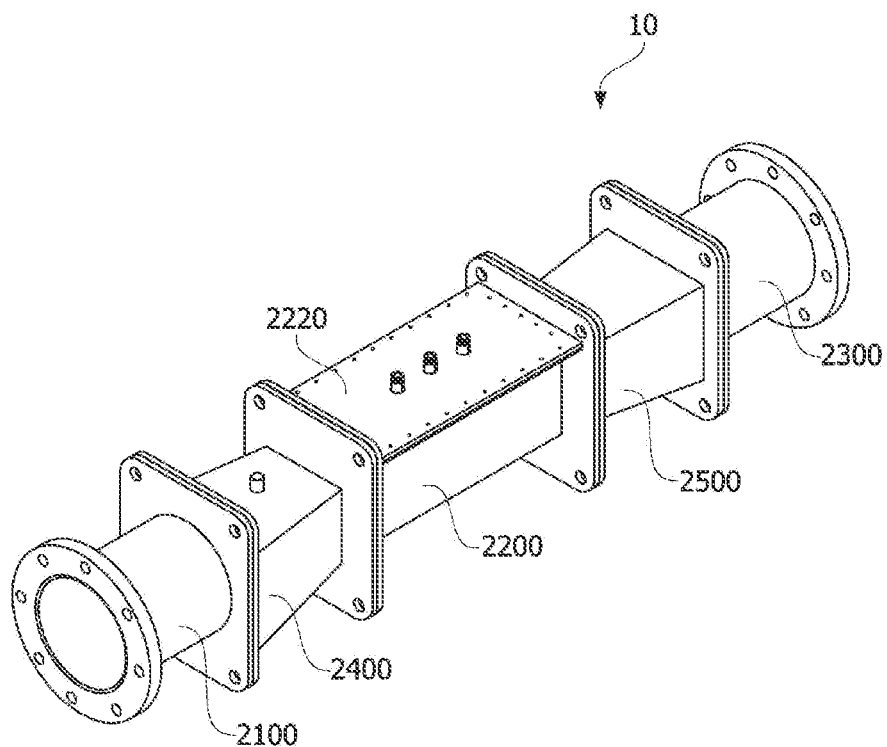
2000: 2100, 2200, 2300, 2400, 2500

[FIG. 2]
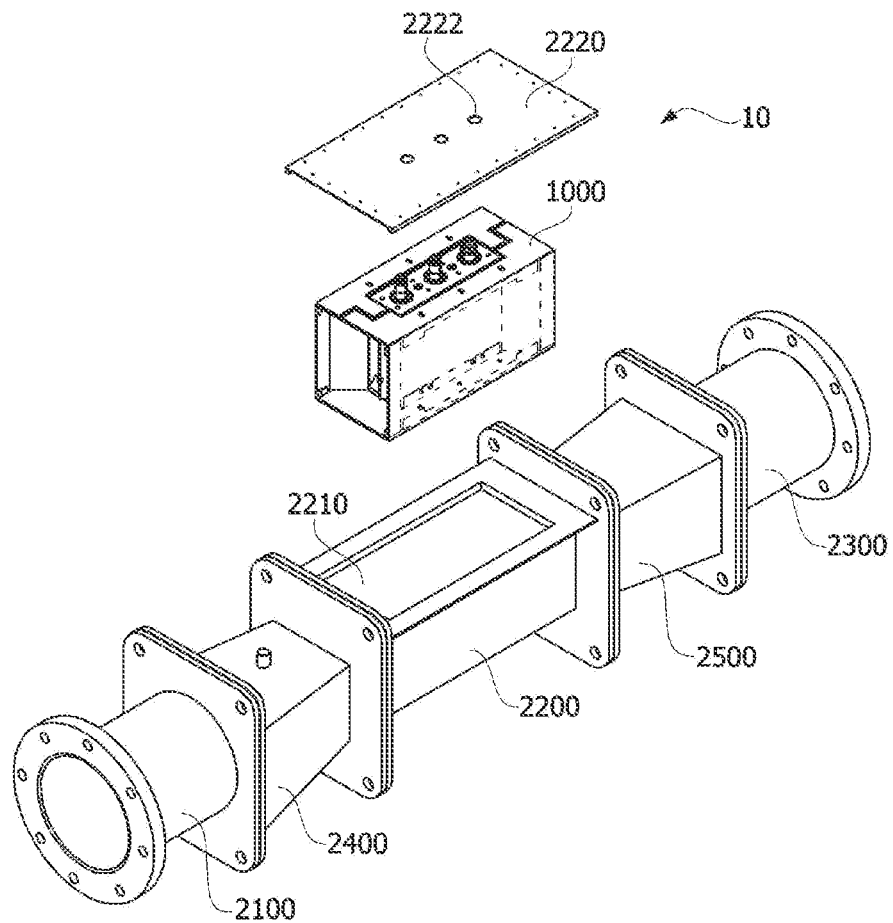
2000: 2100, 2200, 2300, 2400, 2500

[FIG. 3]
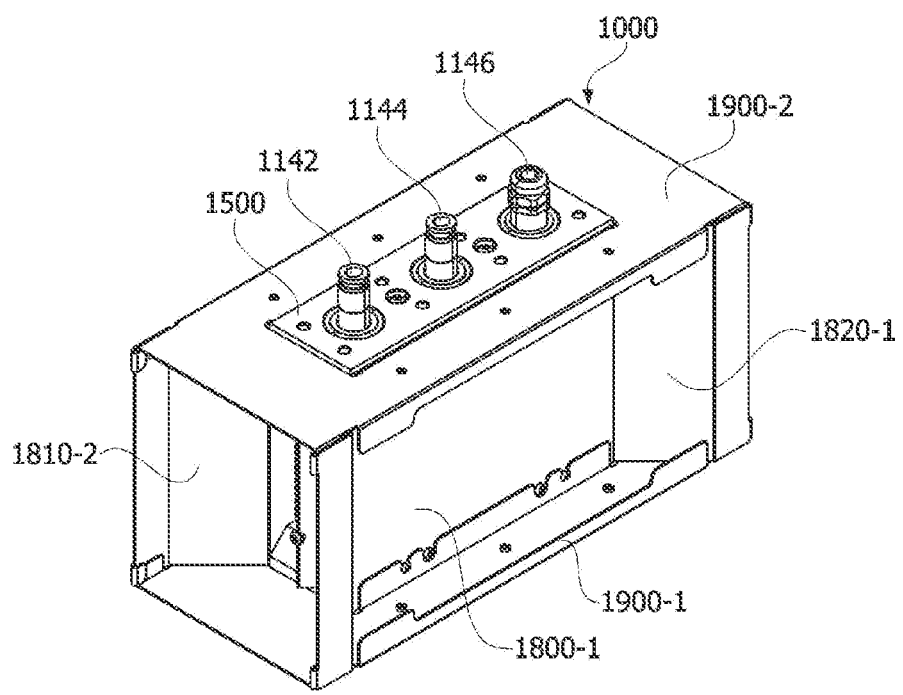

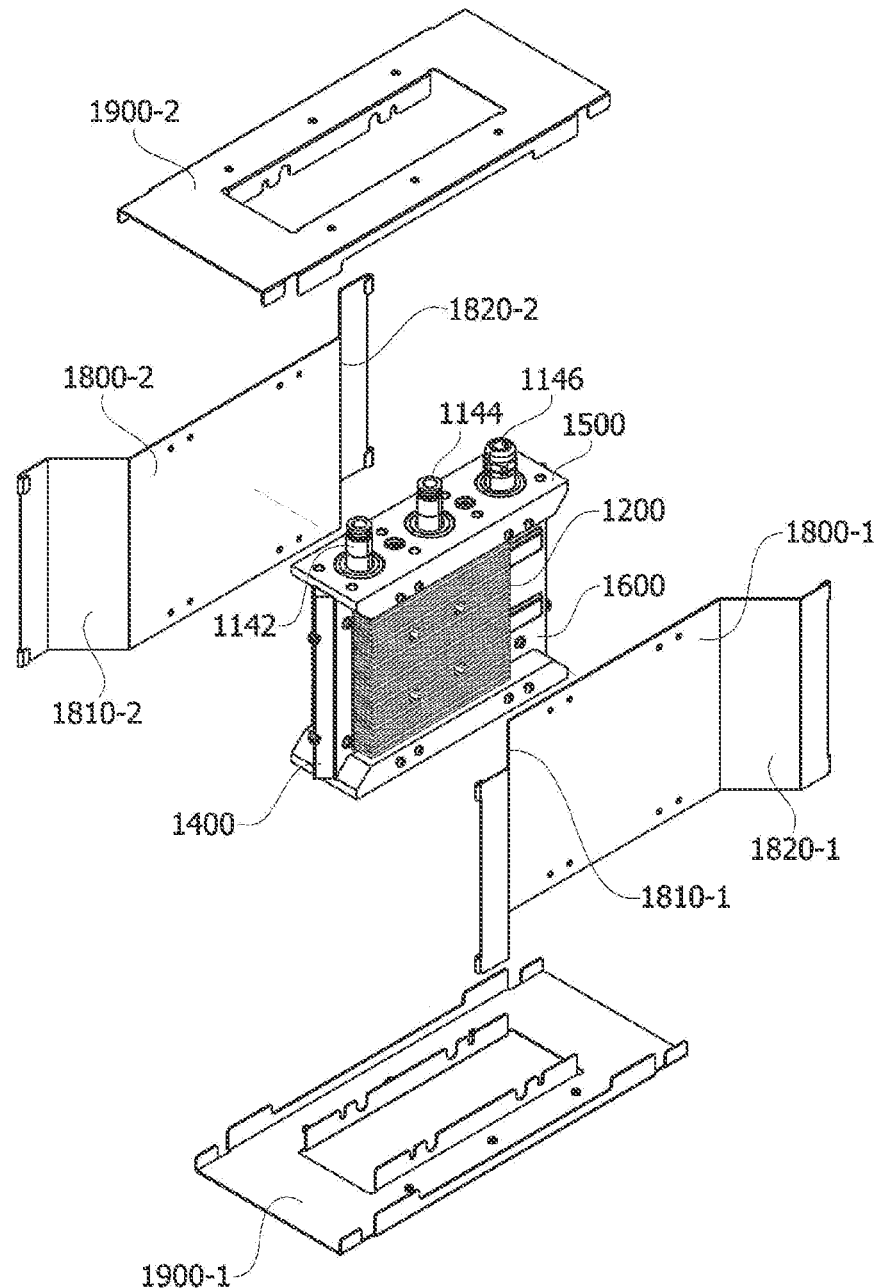

[FIG. 5]
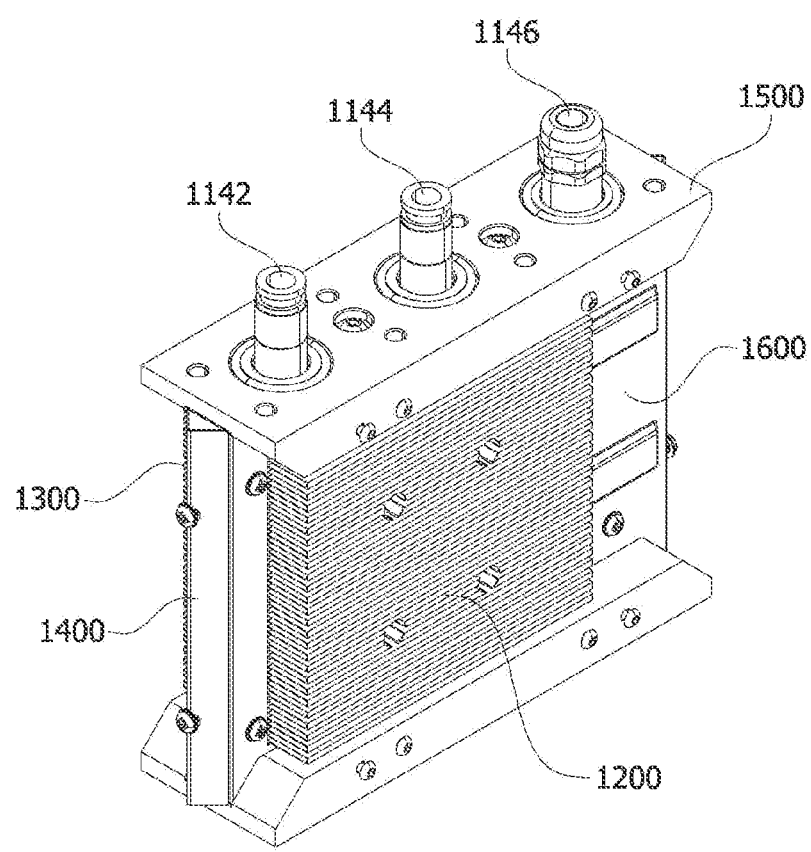

[FIG. 6]
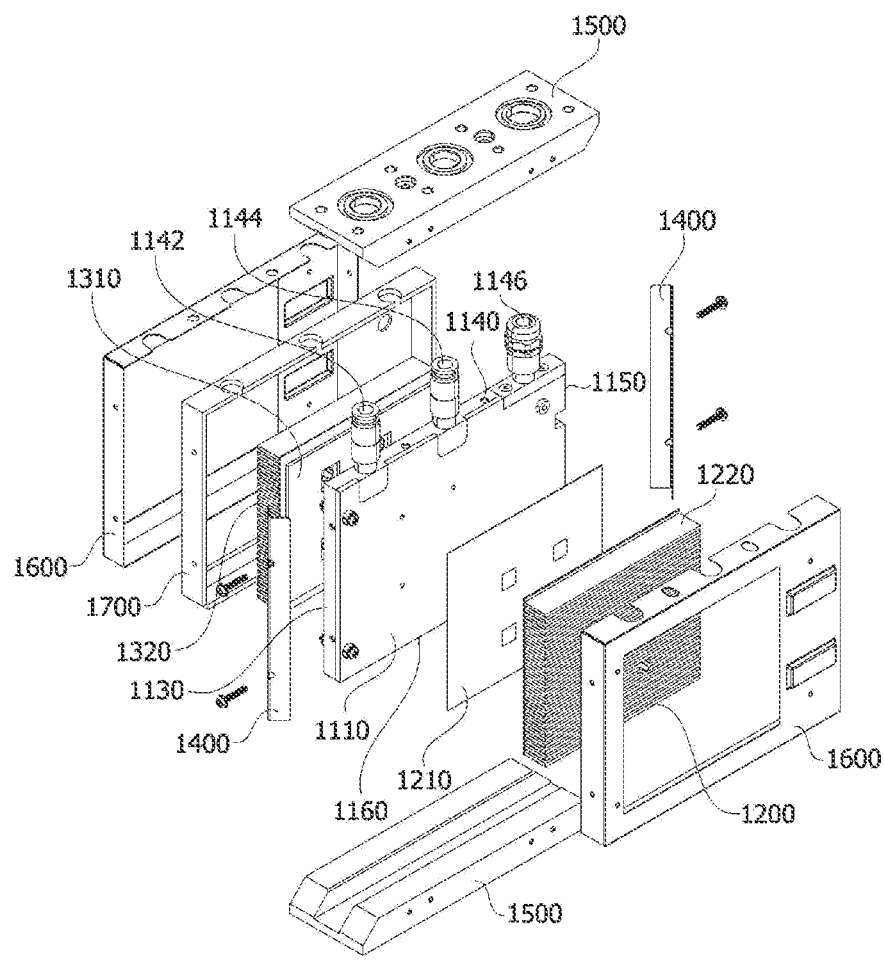
1100: 1110, 1120, 1130, 1140, 1150, 1160

[FIG. 7A]
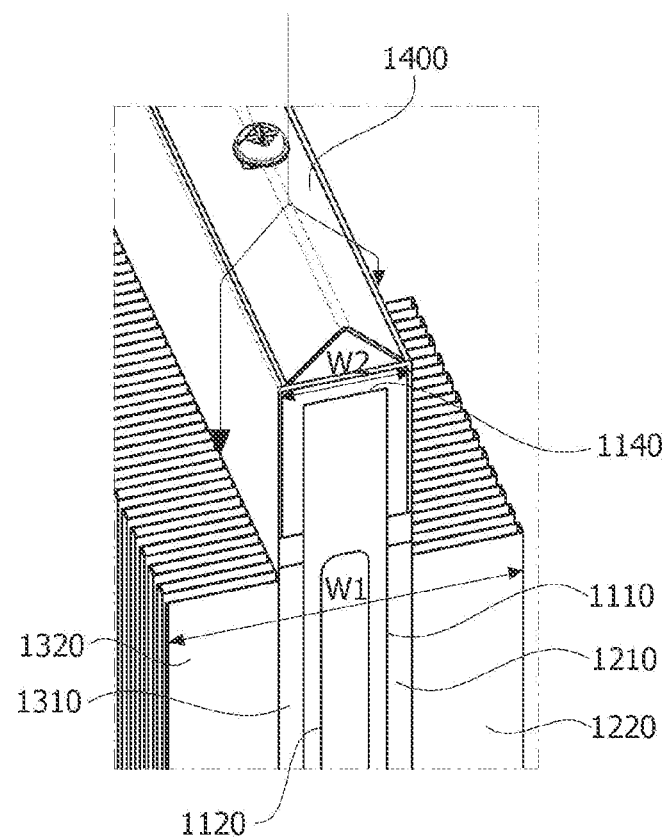

[FIG. 7B]
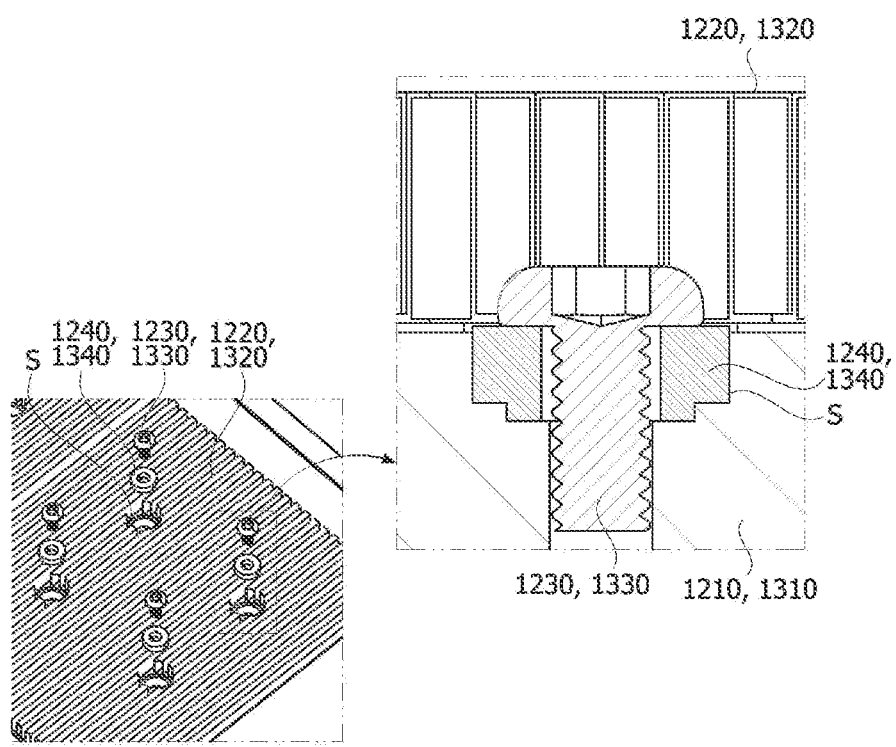

[FIG. 8]
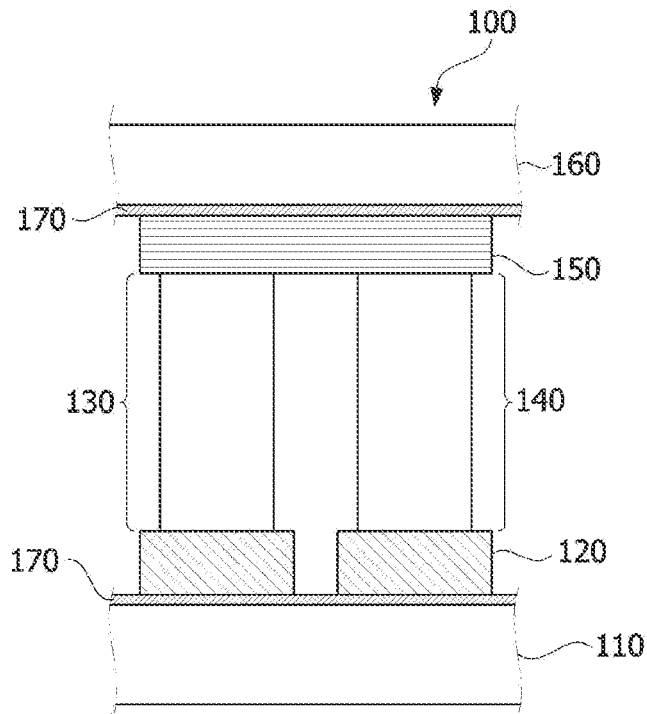
[FIG. 9]
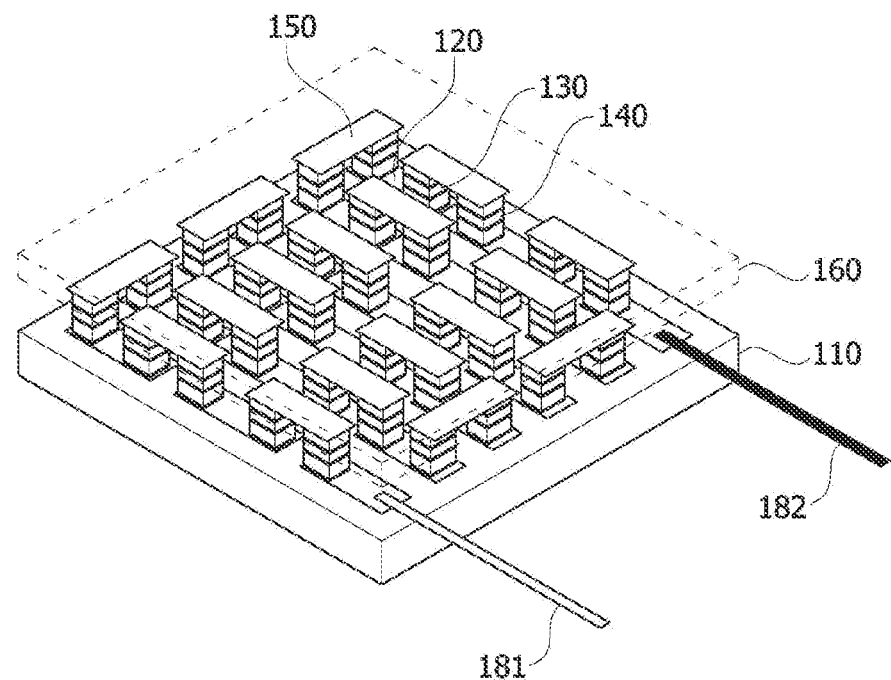

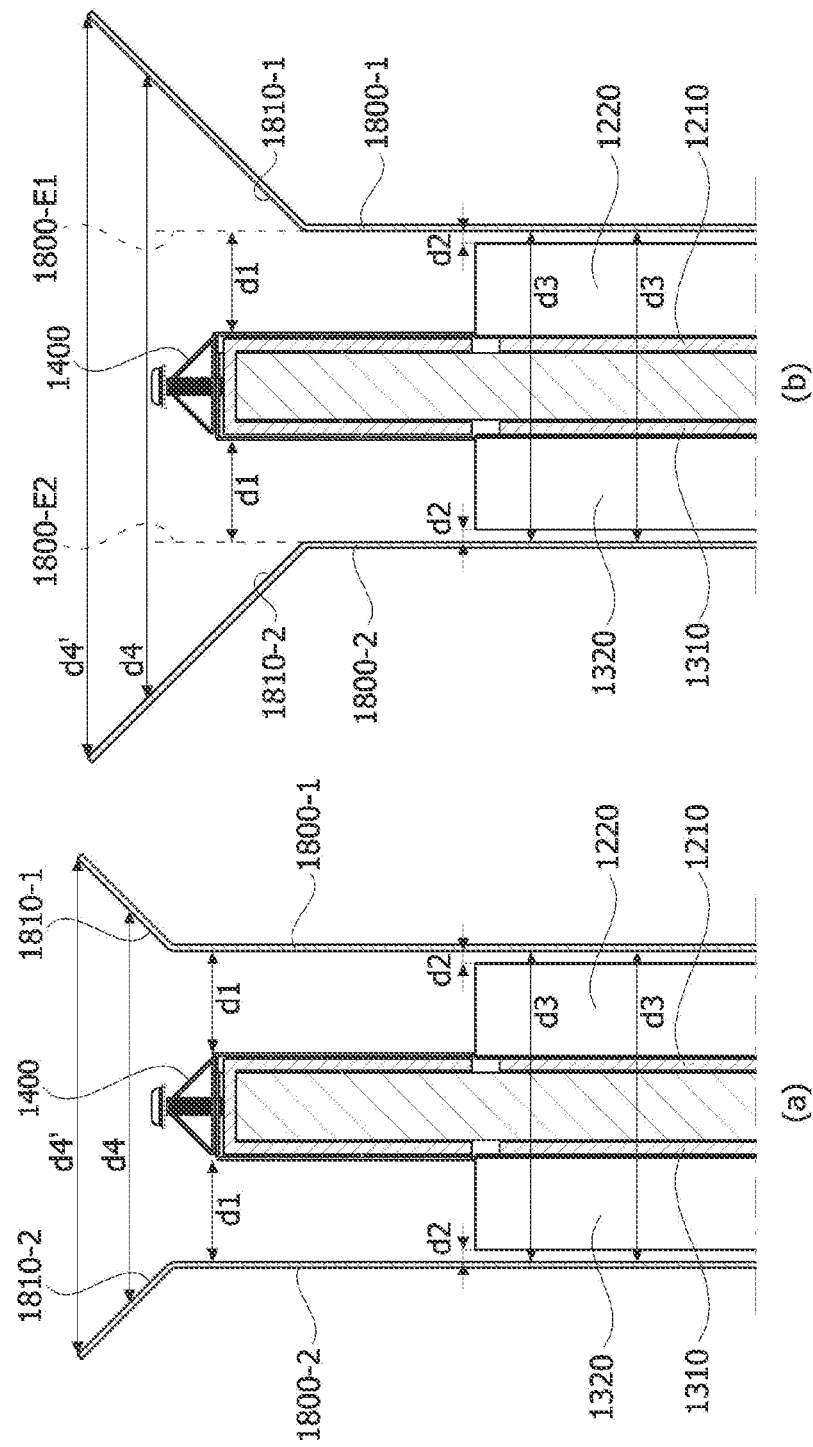
[FIG. 10]

[FIG. 11]
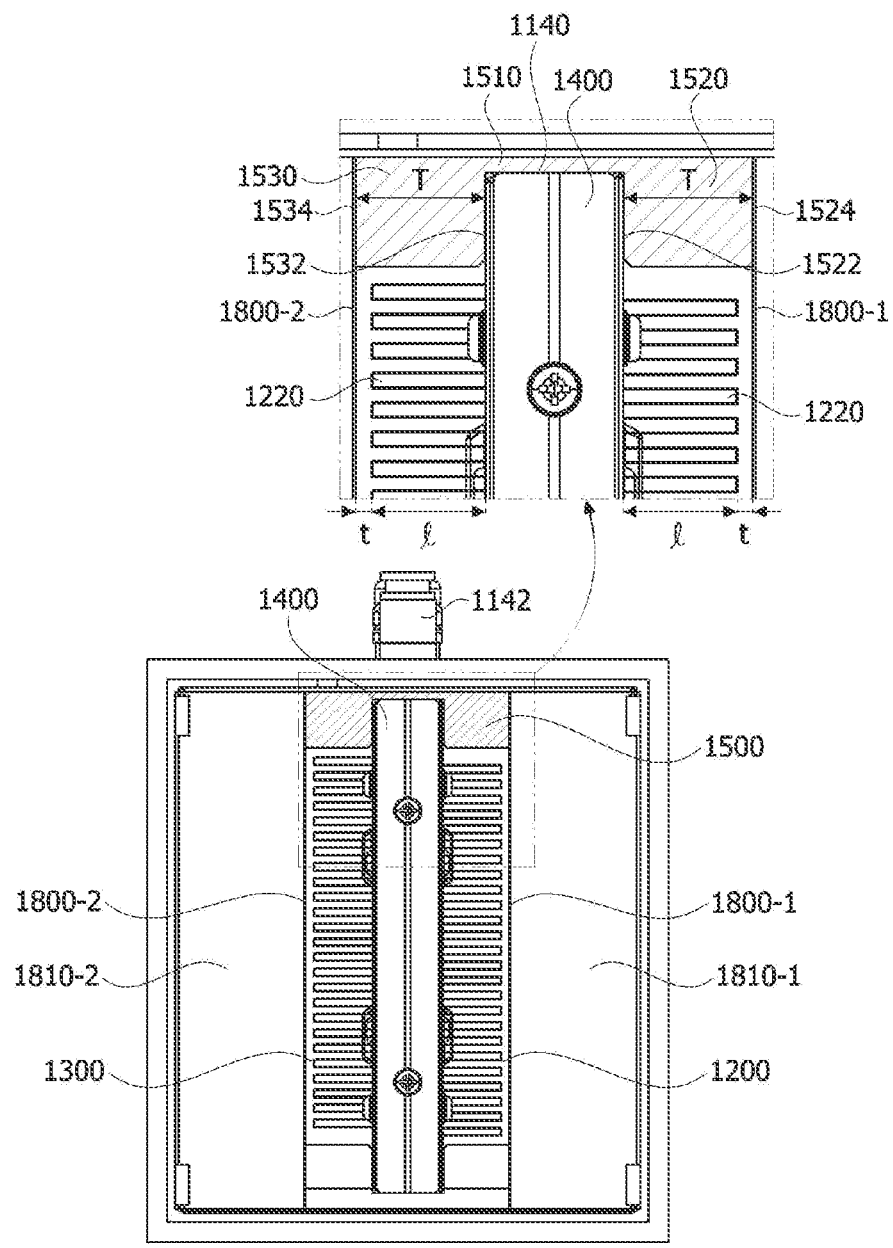

[FIG. 12]
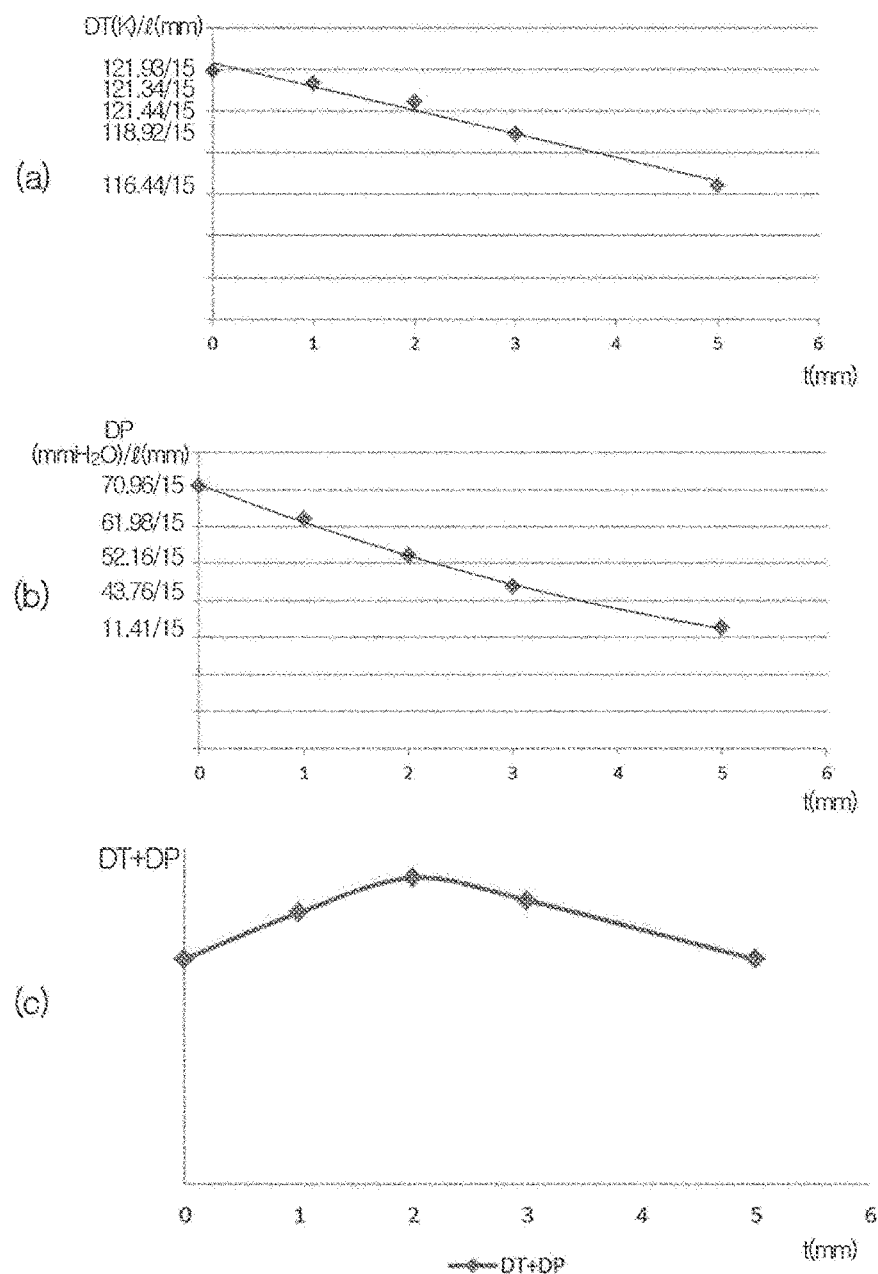

[FIG. 13]
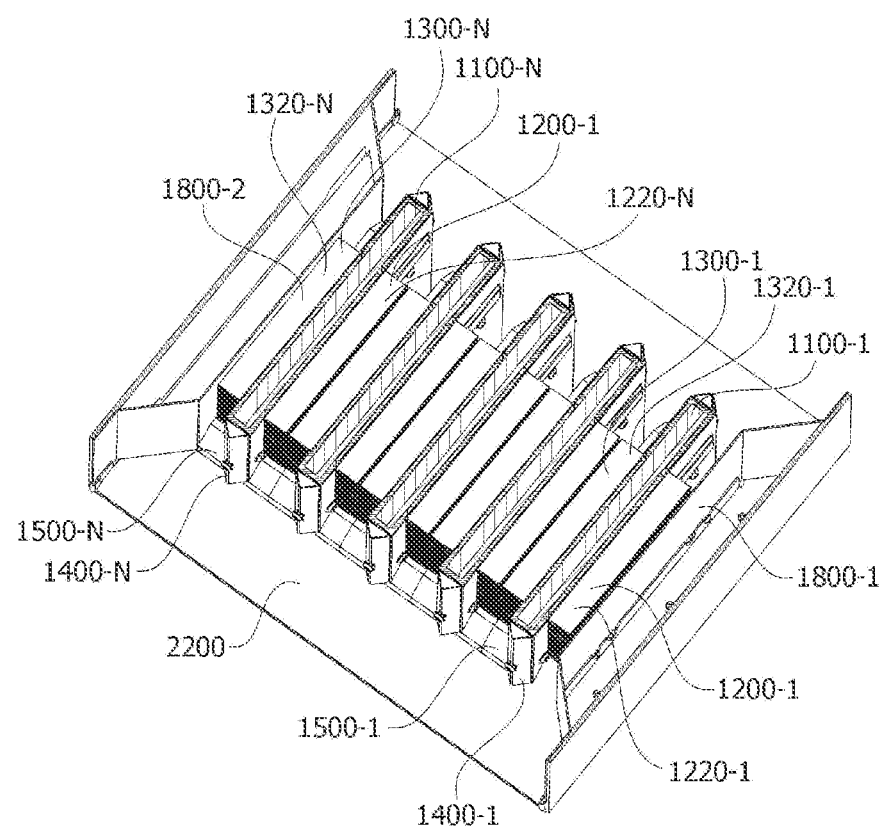

[FIG. 14]
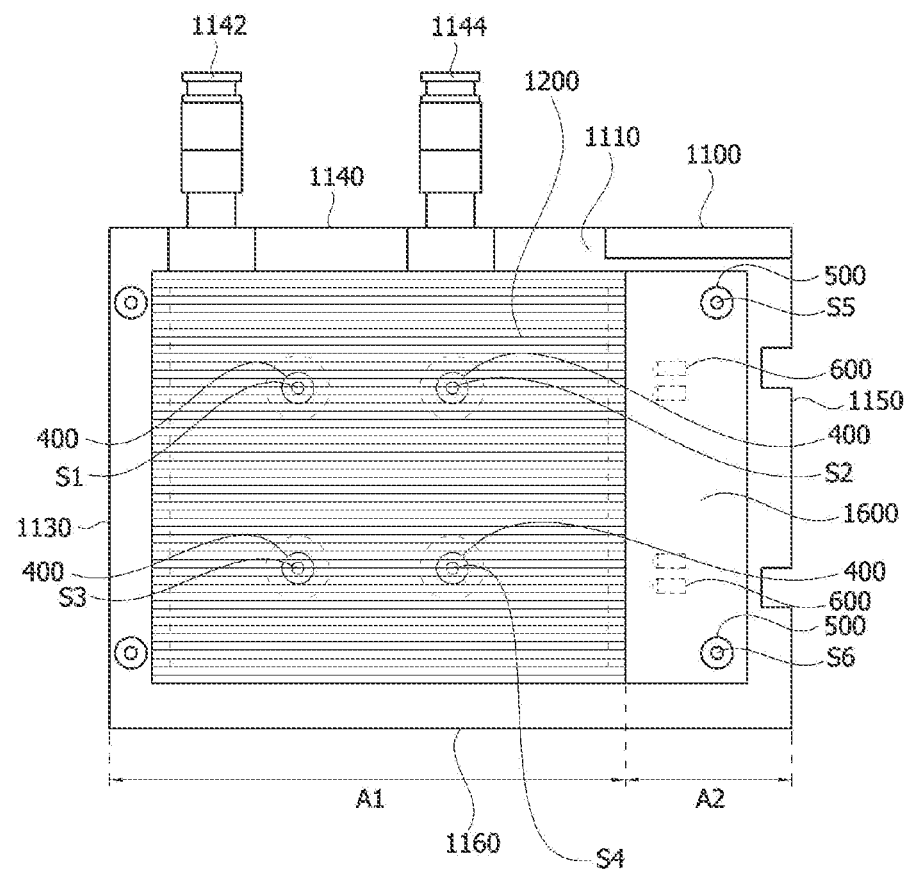

[FIG. 15]
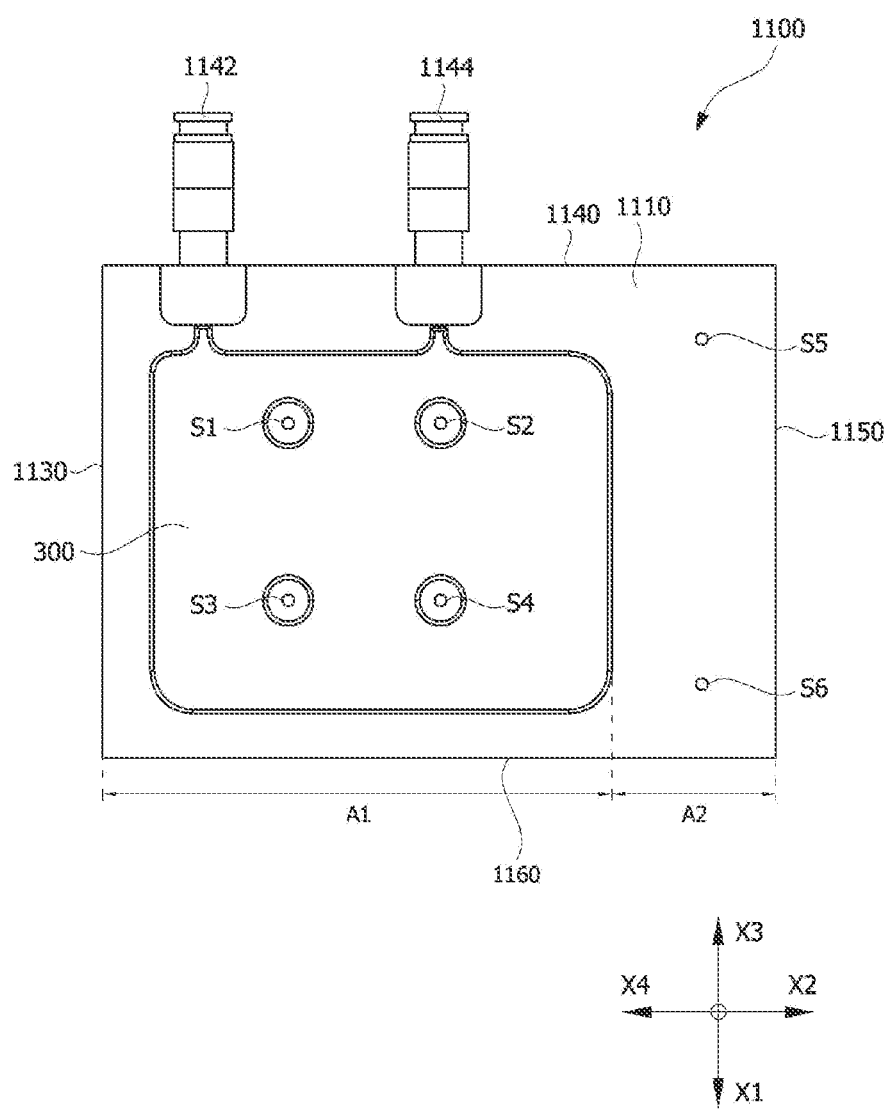

[FIG. 16]
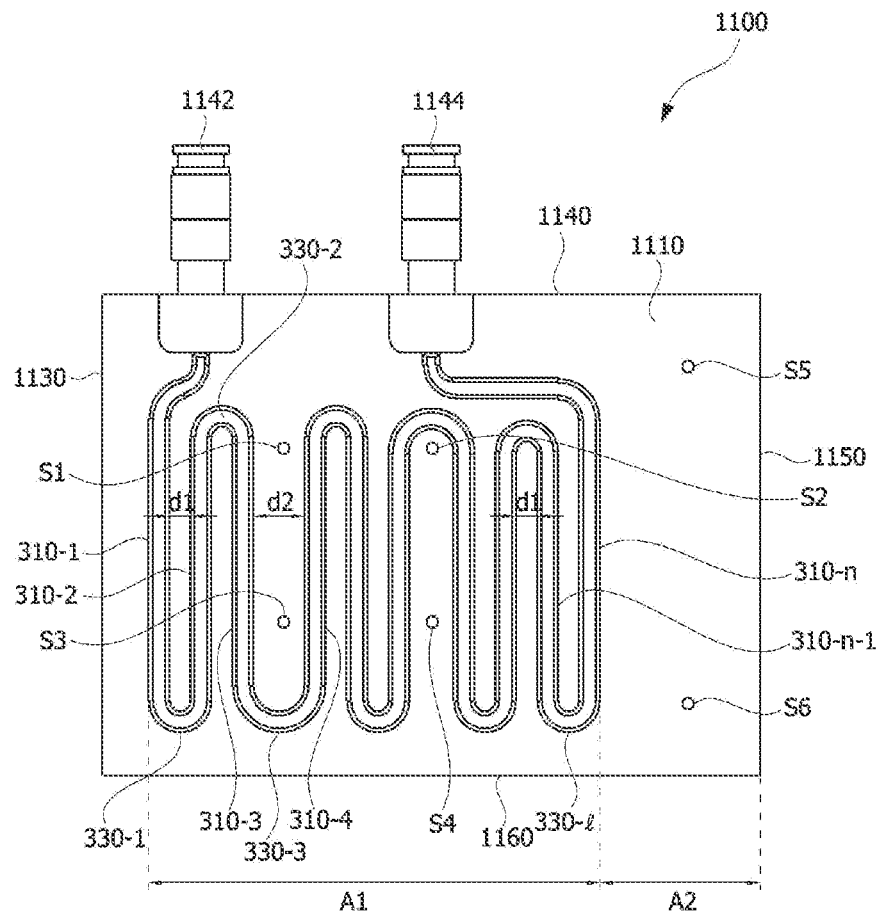

[FIG. 17]
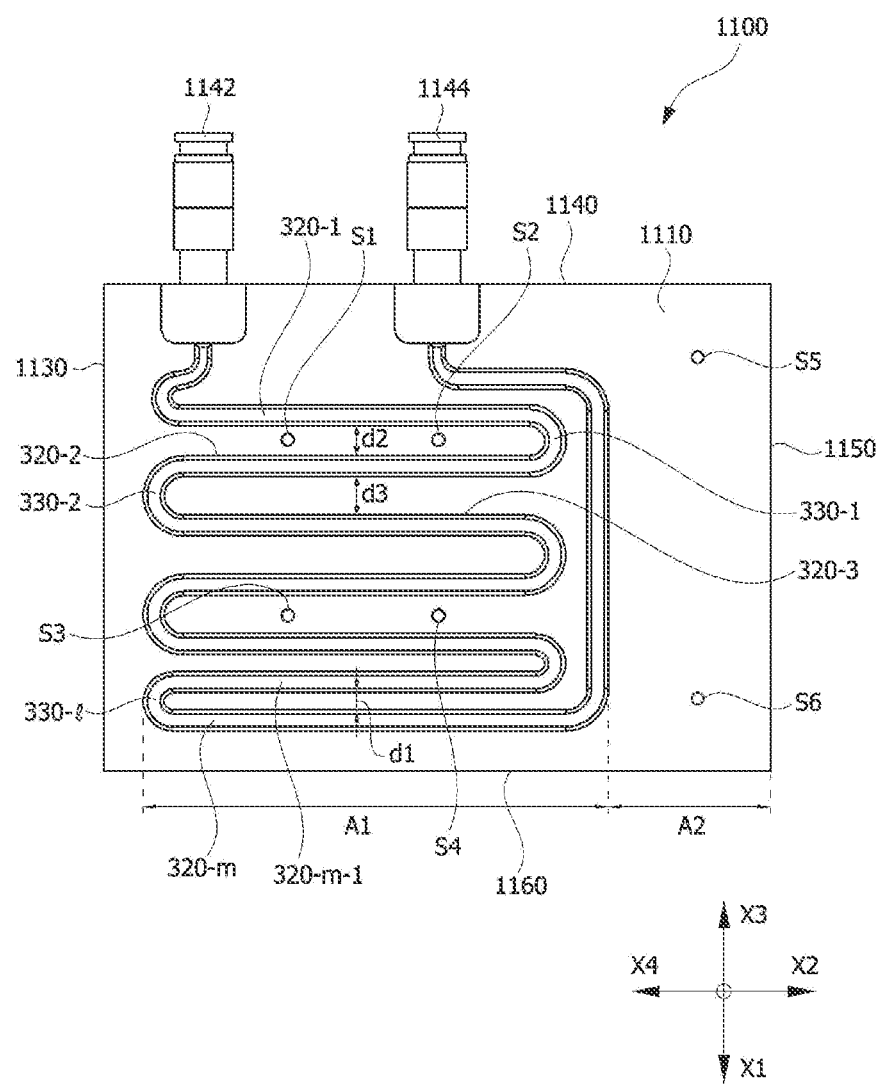

[FIG. 18]
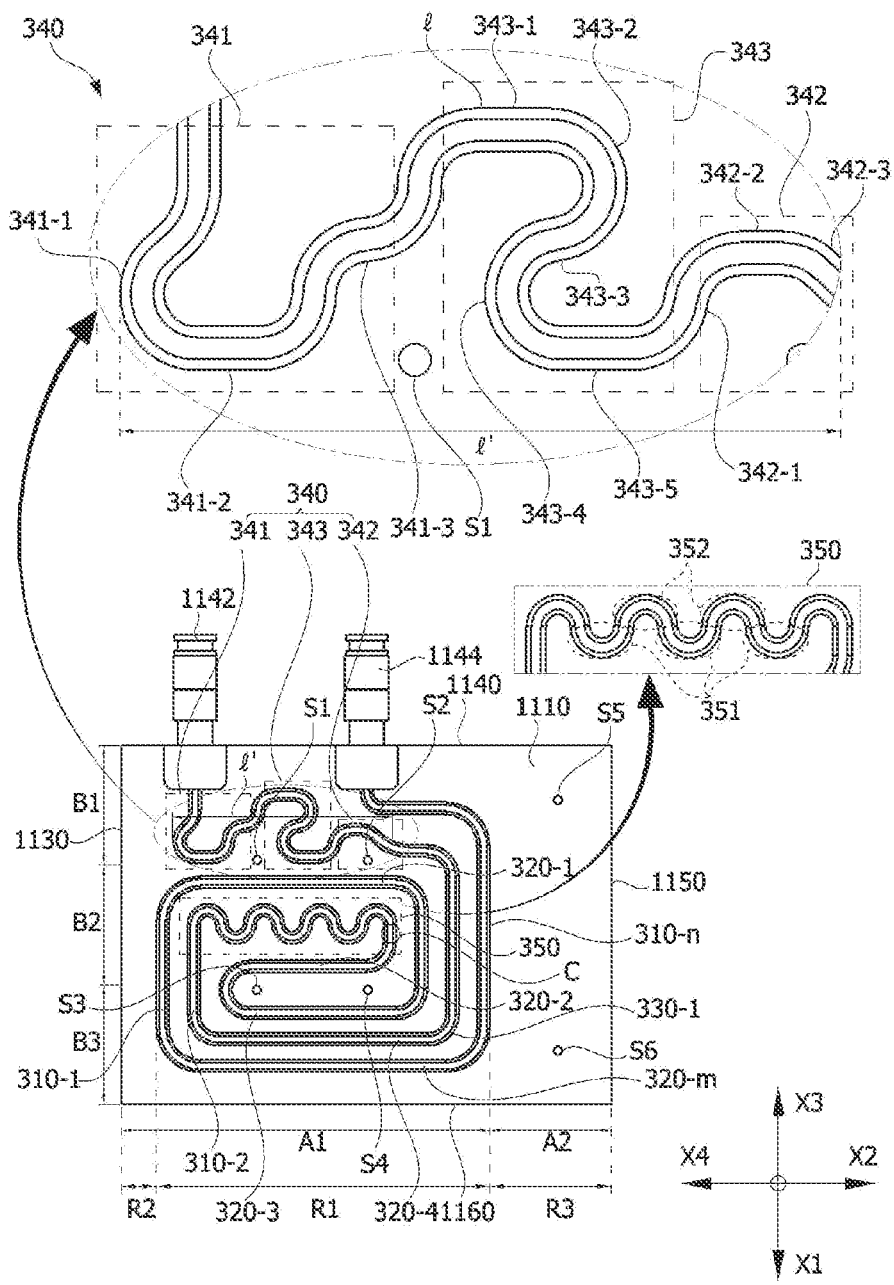

POWER GENERATION APPARATUS

CROSS REFERENCE TO RELATED APPLICATIONS

This application is the National Phase of PCT/KR2021/000333 filed on Jan. 11, 2021, which claims priority under 35 U.S.C. § 119(a) to Patent Application Nos. 10-2020-0004473 filed in the Republic of Korea on Jan. 13, 2020 and 10-2020-0004475 filed in the Republic of Korea on Jan. 13, 2020, all of which are hereby expressly incorporated by reference into the present application.

TECHNICAL FIELD

The present invention relates to a power generation apparatus, and more specifically, to a power generation apparatus for generating power using a temperature difference between a low temperature part and a high temperature part of a thermoelectric element.

BACKGROUND ART

A thermoelectric phenomenon is a phenomenon that occurs by the movement of electrons and holes inside a material and refers to direct energy conversion between heat and electricity.

Thermoelectric elements are a generic term for elements using the thermoelectric phenomenon, and have a structure in which a P-type thermoelectric material and an N-type thermoelectric material are bonded between metal electrodes to form a PN junction pair.

The thermoelectric elements may be classified into an element using a temperature change in electrical resistance, an element using the Seebeck effect, which is a phenomenon in which an electromotive force is generated by a temperature difference, and an element using the Peltier effect, which is a phenomenon in which heat is absorbed or heat is generated by a current.

The thermoelectric elements are variously applied to home appliances, electronic parts, communication parts, and the like. For example, the thermoelectric elements may be applied to a cooling apparatus, a heating apparatus, a power generation apparatus, and the like. Accordingly, the demand for the thermoelectric performance of the thermoelectric element is gradually increasing.

Recently, there has been a need to generate electricity using hot waste heat generated from engines such as vehicles and ships and thermoelectric elements. At this time, a duct through which a first fluid passes is disposed at a low temperature part of the thermoelectric element, a heat dissipation fin is disposed at a high temperature part of the thermoelectric element, and a second fluid having a temperature higher than that of the first fluid may pass through the heat dissipation fin. Accordingly, electricity may be generated by the temperature difference between the low temperature part and the high temperature part of the thermoelectric element, and power generation performance may vary depending on the structure of the power generation apparatus.

Technical Problem

The present invention is directed to providing a power generation apparatus for generating electricity using a temperature difference between a low temperature part and a high temperature part of a thermoelectric element.

Technical Solution

A power generation apparatus according to one embodiment of the present invention includes a cooling unit, a thermoelectric module including a thermoelectric element disposed on one surface of the cooling unit and a heat sink disposed on the thermoelectric element, a guide plate disposed to face the thermoelectric module, and a branch unit disposed on another surface perpendicular to one surface of the cooling unit, wherein the heat sink includes a plurality of heat dissipation fins spaced apart from each other, and a ratio of a shortest horizontal distance between the heat sink and the guide plate to a shortest horizontal distance between the branch unit and the guide plate ranges from 0.0625 to 0.25.

The cooling unit may be a duct through which a first fluid passes, the branch unit may branch a second fluid having a temperature higher than that of the first fluid, and the second fluid may pass between the thermoelectric module and the guide plate.

The shortest horizontal distance between the branch unit and the guide plate may be a shortest horizontal distance between a virtual extension surface of the guide plate facing the thermoelectric module and the branch unit.

The ratio of the shortest horizontal distance between the heat sink and the guide plate to the shortest horizontal distance between the branch unit and the guide plate may range from 0.0625 to 0.167.

The shortest horizontal distance between the heat sink and the guide plate may range from 1 to 3 mm.

The thermoelectric module may include a first thermoelectric module disposed on a first surface of the duct and a second thermoelectric module disposed on a second surface of the duct facing the first surface, the guide plate may include a first guide plate disposed to face the first thermoelectric module and a second guide plate disposed to face the second thermoelectric module, and the second fluid may be branched between the first thermoelectric module and the first guide plate and between the second thermoelectric module and the second guide plate by the branch unit.

The branch unit may be disposed on a third surface between the first surface and the second surface of the duct, and disposed to be inclined with respect to the first surface.

The third surface may be perpendicular to the first surface.

The power generation apparatus may further include a separation member configured to separate the duct and the guide plate by a predetermined interval.

The separation member may include a first region disposed between the first surface and the second surface of the duct, and disposed on a fourth surface perpendicular to the third surface, a second region extending from the first region toward the first surface, and a third region extending from the first region toward the second surface, wherein a first face of the second region may be disposed on the first surface, a second face of the second region may be disposed on the first guide plate, a first face of the third region may be disposed on the second surface, and a second face of the third region may be disposed on the second guide plate.

A power generation apparatus according to one embodiment of the present invention includes a cooling unit, a thermoelectric module including a thermoelectric element disposed in a first region of a surface of the cooling unit and a heat sink disposed on the thermoelectric element, a guide plate disposed to face the thermoelectric module, and a separation member disposed between a second region of a surface of the duct and the guide plate, wherein the heat sink is spaced apart from the guide plate by a predetermined distance, and the separation member comes into contact with the guide plate and the cooling unit.

The cooling unit may be the duct through which a first fluid passes, and a second fluid may pass between the heat sink and the guide plate.

The power generation apparatus may include a branch unit disposed on the duct to branch the second fluid, and the second fluid branched by the branch unit may pass between the thermoelectric module and the guide plate.

The shortest horizontal distance between the branch unit and the guide plate may range from 6.5 to 20 mm.

The shortest horizontal distance between the branch unit and the guide plate may be the shortest horizontal distance between a virtual extension surface of the guide plate facing the thermoelectric module and the branch unit.

The shortest distance between the heat sink and the guide plate may range from 1 to 3 mm.

The thermoelectric module may include a first thermoelectric module disposed on a first surface of the duct and a second thermoelectric module disposed on a second surface of the duct facing the first surface, the guide plate may include a first guide plate disposed to face the first thermoelectric module and a second guide plate disposed to face the second thermoelectric module, and the second fluid may be branched between the first thermoelectric module and the first guide plate and between the second thermoelectric module and the second guide plate by the branch unit.

A power generation system according to one embodiment of the present invention includes a plurality of power generation apparatuses disposed adjacent to each other, wherein each power generation apparatus includes a cooling unit, a first thermoelectric module including a first thermoelectric element disposed on a first surface of the cooling unit and a first heat sink disposed on the first thermoelectric element, a second thermoelectric module including a second thermoelectric element disposed on a second surface of the cooling unit and a second heat sink disposed on the second thermoelectric element, and a separation member disposed between the first surface and the second surface of the cooling unit, wherein one of the first heat sink and the second heat sink of each power generation apparatus is spaced apart from one of the first heat sink and the second heat sink of an adjacent power generation apparatus, and the separation member of each power generation apparatus comes into contact with the separation member of adjacent power generation apparatus.

The power generation system may further include a first guide plate disposed to be spaced apart from a first heat sink of a first power generation apparatus that is one of the plurality of power generation apparatuses, and a second guide plate disposed to be spaced apart from a second heat sink of a second power generation apparatus that is another one of the plurality of power generation apparatuses, wherein a separation member of the first power generation apparatus may come into contact with the first guide plate, and a separation member of the second power generation apparatus may come into contact with the second guide plate.

The remaining power generation apparatuses among the plurality of power generation apparatuses may be disposed between the first power generation apparatus and the second power generation apparatus.

A power generation apparatus according to another embodiment of the present invention includes a cooling unit including a flow path therein, and a thermoelectric module disposed on one surface of the cooing unit, wherein the flow path includes a plurality of first flow path portions disposed in a first direction, a plurality of second flow path portions disposed in a second direction perpendicular to the first direction, and a plurality of bending portions configured to connect the first flow path portions and the second flow path portions, the plurality of second flow path portions include a first straight portion, a second straight portion, and an uneven portion spaced apart from each other and disposed straightly in the first direction, and the uneven portion is disposed between the first straight portion and the second straight portion.

The cooling unit may include a plurality of protrusions connected to the flow path, and spaced apart from each other in the second direction.

The cooling unit may include a plurality of through holes passing through one surface on which the thermoelectric module is disposed and the other surface facing the one surface.

The power generation apparatus may include a plurality of coupling members configured to couple the cooling unit and the thermoelectric module, and the coupling members may be disposed in the plurality of through holes.

The plurality of through holes may include a plurality of first through holes disposed between the uneven portion and the protrusions.

The flow path may include a bent portion disposed between the plurality of first through holes and the protrusion, and the first straight portion may be disposed between the bent portion and the uneven portion.

A plurality of curvature portions with the same curvature may be periodically disposed in the uneven portion.

The bent portion may include a region having a plurality of curvatures with different curvatures.

The cooling unit may include a first side surface on which the plurality of protrusions are positioned, and a second side surface facing the first side surface, and the plurality of through holes may include a plurality of second through holes disposed between the uneven portion and the second side surface.

The plurality of first through holes and the plurality of second through holes may overlap the flow path in the first direction, the plurality of through holes may include a plurality of third through holes that do not overlap the flow path in the first direction, and the plurality of third through holes may include a 3-1st through hole closer to the first side surface than the plurality of first through holes, and a 3-2nd through hole closer to the second side surface than the plurality of second through holes.

The cooling unit may include a third side surface disposed between the first side surface and the second side surface and disposed in the first direction, and a fourth side surface facing the third side surface, and include an overlapping portion overlapping the flow path in the second direction, a first region positioned between the overlapping portion and the third side surface, and a second region positioned between the overlapping portion and the fourth side surface, and a width of the second region in the second direction may be greater than a width of the first region in the second direction.

The plurality of third through holes may be positioned in the second region.

A connector may be positioned in the second region.

The thermoelectric module may be coupled to the cooling unit through a coupling member, and the coupling member may be disposed in the plurality of through holes.

The coupling member and the flow path may not overlap in a third direction from one surface of the cooling unit toward the other surface.

The plurality of protrusions may include a first protrusion and a second protrusion, and the first protrusion and the second protrusion may not overlap the plurality of third through holes in the first direction.

The plurality of protrusions may include a third protrusion spaced apart from the first protrusion and the second protrusion in the second direction.

A power generation apparatus according to another embodiment of the present invention includes a cooling unit including a flow path therein and including a plurality of protrusions connected to the flow path; and a thermoelectric module coupled to the cooling unit, wherein the plurality of protrusions include a first protrusion and a second protrusion disposed on a first outer surface of the cooling unit and spaced apart from each other in a first direction, the flow path includes a first flow path spirally extending from the first protrusion toward a center portion of the cooling unit, and a second flow path spirally extending from the center portion toward the second protrusion, and the first flow path includes a first uneven portion disposed adjacent to the first outer surface and having irregularity, and a second uneven portion disposed adjacent to the center portion and having a regular period.

The cooling unit may further include a second outer surface facing the first outer surface, in which the first flow path may include a first straight portion extending in the first direction, the second flow path may include a second straight portion, a third straight portion, and a fourth straight portion extending in the first direction, the third straight portion may be disposed between the second straight portion and the second outer surface, the fourth straight portion may be disposed between the second straight portion and the first outer surface, and the second uneven portion may be disposed between the second straight portion and the fourth straight portion.

The cooling unit may include a third outer surface and a fourth outer surface disposed to face each other between the first outer surface and the second outer surface, include one surface on which the thermoelectric module is disposed and the other surface facing the one surface, and include a plurality of through holes passing through the one surface and the other surface, wherein the plurality of through holes may include a first through hole disposed between the first uneven portion and the fourth straight portion, a second through hole disposed between the second straight portion and the third straight portion, and a plurality of third through holes disposed between the flow path and the fourth outer surface, the plurality of third through holes may further include a 3-1st through hole disposed closer to the first outer surface than the first through hole, and a 3-2nd through hole disposed closer to the second outer surface than the second through hole, and a first horizontal distance between the flow path and the fourth outer surface may be greater than a second horizontal distance between the flow path and the third outer surface.

Advantageous Effects

According to an embodiment of the present invention, it is possible to obtain a power generation apparatus with excellent power generation performance. In addition, according to an embodiment of the present invention, it is possible to obtain a power generation apparatus with improved heat transfer efficiency to a thermoelectric element.

In addition, according to an embodiment of the present invention, it is possible to maximize power generation efficiency by optimizing the pressure difference and flow rate of a fluid before and after passing through a power generation apparatus.

DESCRIPTION OF DRAWINGS

FIG. 1 is a perspective view of a power generation system according to one embodiment of the present invention.

FIG. 2 is an exploded perspective view of the power generation system according to one embodiment of the present invention.

FIG. 3 is a perspective view of a power generation apparatus included in the power generation system according to one embodiment of the present invention.

FIG. 4 is an exploded view of the power generation apparatus according to one embodiment of the present invention.

FIG. 5 is a perspective view of a power generation module included in the power generation apparatus according to one embodiment of the present invention.

FIG. 6 is an exploded perspective view of the power generation module according to one embodiment of the present invention.

FIGS. 7A and 7B are partially enlarged views of the power generation module according to one embodiment of the present invention.

FIGS. 8 and 9 are a cross-sectional view and a perspective view of a thermoelectric element included in the power generation module according to one embodiment of the present invention.

FIG. 10, (a) and (b) are partial cross-sectional views of the power generation apparatus according to one embodiment of the present invention.

FIG. 11 is a plan view of the power generation apparatus according to one embodiment of the present invention.

FIG. 12, (a) shows the relationship between a distance between a heat sink and a guide plate and a temperature difference of the thermoelectric element, (b) shows the relationship between the distance between the heat sink and the guide plate and a pressure difference of a second fluid, and (c) is a graph showing the relationship of the distance between the heat sink and the guide plate by correcting the temperature difference of the thermoelectric element and the pressure difference of the second fluid.

FIG. 13 shows a power generation system according to another embodiment of the present invention.

FIG. 14 is a top view of the power generation module according to one embodiment of the present invention.

FIG. 15 is a cross-sectional view of a cooling unit according to one embodiment of the present invention.

FIG. 16 is a cross-sectional view of a cooling unit according to another embodiment of the present invention.

FIG. 17 is a cross-sectional view of a cooling unit according to still another embodiment of the present invention.

FIG. 18 is a cross-sectional view of a cooling unit according to yet another embodiment of the present invention.

MODES OF THE INVENTION

Hereinafter, exemplary embodiments of the present invention will be described in detail with reference to the accompanying drawings.

However, the technical spirit of the present invention is not limited to some embodiments described but may be implemented in various different forms, and one or more of the components may be used by being selectively coupled or substituted between the embodiments without departing from the technical spirit scope of the present invention.

In addition, terms (including technical and scientific terms) used in the embodiments of the present invention may be construed as the meaning that may be generally understood by those skilled in the art to which the present invention pertains, unless specifically defined and described explicitly, and the meaning of generally used terms such as terms defined in the dictionary may be construed in consideration of the contextual meaning of the related art.

In addition, the terms used in the embodiments of the present invention are intended to describe the embodiments and are not intended to limit the present invention.

In this specification, the singular form may also include the plural form unless otherwise specified in the phrase, and when it is described as "at least one (or one or more) of A and B, C", it may include one or more of all possible combinations of A, B, and C.

In addition, in describing the components of the embodiment of the present invention, terms such as first, second, A, B, (a), and (b) may be used.

These terms are only intended to distinguish the component from other components, and the essence, sequence, or order of the corresponding components are not limited by the terms.

In addition, when it is described that a component is 'connected', 'coupled', or 'joined' to another component, this may include a case in which the component is not only directly connected, coupled, or joined to another component, but also a case in which the component is 'connected', 'coupled', or 'joined' to another component through other components interposed therebetween.

In addition, when a component is described as being formed or disposed on "top (above) or bottom (below)" of each component, the top (above) or bottom (below) includes not only a case in which two components come into direct contact with each other but also a case in which one or more other components are formed or disposed between the two components. In addition, when expressed as "top (above) or bottom (below)", this may also include the meaning of not only an upward direction but also a downward direction with respect to one component.

FIG. 1 is a perspective view of a power generation system according to one embodiment of the present invention, FIG. 2 is an exploded perspective view of the power generation system according to one embodiment of the present invention, and FIG. 3 is a perspective view of a power generation apparatus included in the power generation system according to one embodiment of the present invention. FIG. 4 is an exploded view of the power generation apparatus according to one embodiment of the present invention, FIG. 5 is a perspective view of a power generation module included in the power generation apparatus according to one embodiment of the present invention, and FIG. 6 is an exploded perspective view of the power generation module according to one embodiment of the present invention. FIG. 7 is a partially enlarged view of the power generation module according to one embodiment of the present invention, and FIGS. 8 and 9 are a cross-sectional view and a perspective view of a thermoelectric element included in the power generation module according to one embodiment of the present invention.

Referring to FIGS. 1 and 2, a power generation system 10 includes a power generation apparatus 1000 and a fluid tube 2000.

A fluid introduced into the fluid tube 2000 may be a heat source generated by an engine of a vehicle or a ship, or a power plant or a steel mill, but is not limited thereto. A temperature of the fluid discharged from the fluid tube 2000 is lower than a temperature of the fluid introduced into the fluid tube 2000. For example, the temperature of the fluid introduced into the fluid tube 2000 may be 100° C. or higher, preferably, 200° C. or higher, and more preferably, 220° C. to 250° C., but is not limited thereto, and may be variously applied depending on a temperature difference between a high temperature part and a low temperature part of a thermoelectric element.

The fluid tube 2000 includes a fluid inlet 2100, a fluid passing part 2200, and a fluid outlet 2300. The fluid introduced through the fluid inlet 2100 passes through the fluid passing part 2200 and is discharged through the fluid outlet 2300. At this time, the power generation apparatus 1000 according to the embodiment of the present invention is disposed in the fluid passing part 2200, and the power generation apparatus 1000 generates electricity using a temperature difference between a first fluid passing through the power generation apparatus 1000 and a second fluid passing through the fluid passing part 2200. Here, the first fluid may be a cooling fluid, and the second fluid may be a hot fluid having a temperature higher than that of the first fluid. The power generation apparatus 1000 according to the embodiment of the present invention may generate electricity using the temperature difference between the first fluid flowing through one surface of the thermoelectric element and the second fluid flowing through the other surface of the thermoelectric element. Accordingly, in this specification, the first fluid and/or the second fluid may include gas, liquid, and the like. When cross-sectional shapes of the fluid inlet 2100 and the fluid outlet 2300 are different from a cross-sectional shape of the fluid passing part 2200, the fluid tube 2000 may further include a first connection part 2400 configured to connect the fluid inlet 2100 and the fluid passing part 220 and a second connection part 2500 configured to connect the fluid passing part 2200 and the fluid outlet 2300. For example, the general fluid inlet 2100 and fluid outlet 2300 may have a cylindrical shape. In contrast, the fluid passing part 2200 in which the power generation apparatus 1000 is disposed may have a quadrangular tubular or polygonal tubular shape. Accordingly, the fluid inlet 2100 and one end of the fluid passing part 2200 may be connected, and the fluid outlet 2300 and the other end of the fluid passing part 2200 may be connected via the first connection part 2400 and the second connection part 2500 whose one end has a cylindrical tubular shape and the other end has a quadrangular tubular shape.

At this time, the fluid inlet 2100 and the first connection part 2400, the first connection part 2400 and the fluid passing part 2200, the fluid passing part 2200 and the second connection part 2500, and the second connection part 2500 and the fluid outlet 2300 may be connected to each other by fastening members.

As described above, the power generation apparatus 1000 according to the embodiment of the present invention may be disposed in the fluid passing part 2200. To easily assemble the power generation system 10, one surface of the fluid passing part 2200 may be designed to have an openable/closable structure. After one surface 2210 of the fluid passing part 2200 is open, the power generation apparatus 1000 may be received in the fluid passing part 2200, and the open one surface 2210 of the fluid passing part 2200 may be covered by a cover 2220. At this time, the cover 2220 may be fastened to the open one surface 2210 of the fluid passing part 2200 by a plurality of fastening members.

The first fluid is supplied to the power generation apparatus 1000 from the outside and then discharged to the outside again, and when a wiring connected to the power generation apparatus 1000 is drawn out to the outside, the cover 2220 may also be formed with a plurality of holes 2222 in order to introduce and discharge the first fluid and draw out the wiring.

Referring to FIGS. 3 to 7, the power generation apparatus 1000 according to the embodiment of the present invention includes a duct 1100, a first thermoelectric module 1200, a second thermoelectric module 1300, a branch unit 1400, a separation member 1500, a shield member 1600, and a heat insulating member 1700. In addition, the power generation apparatus 1000 according to the embodiment of the present invention further includes a guide plate 1800 and a support frame 1900.

As shown in FIG. 5, the duct 1100, the first thermoelectric module 1200, the second thermoelectric module 1300, the branch unit 1400, the separation member 1500, the shield member 1600, and the heat insulating member 1700 may be assembled into one module, and in this specification, this may be referred to as a power generation module.

The power generation apparatus 1000 according to the embodiment of the present invention may generate power using the temperature difference between the first fluid flowing through an inside of the duct 1100 and the second fluid passing through the heat sinks 1220 and 1320 of the first thermoelectric module 1200 and the second thermoelectric module 1300 disposed outside the duct 1100.

In this specification, the temperature of the first fluid flowing through the inside of the duct 1100 may be lower than the temperature of the second fluid passing through heat sinks 1220 and 1320 of the thermoelectric modules 1200 and 1300 disposed outside the duct 1100. In this specification, the first fluid may be a coolant for cooling, and the second fluid may be a high temperature gas. To this end, the first thermoelectric module 1200 may be disposed on one surface of the duct 1100, and the second thermoelectric module 1300 may be disposed on another surface of the duct 1100. At this time, a surface disposed to face the duct 1100 of both surfaces of each of the first thermoelectric module 1200 and the second thermoelectric module 1300 becomes the low temperature part, and power may be generated by using the temperature difference between the low temperature part and the high temperature part. Accordingly, in this specification, the duct 1100 may be referred to as a cooling unit.

The first fluid introduced into the duct 1100 may be water, but is not limited thereto, and may be various types of fluids having cooling performance. The temperature of the first fluid introduced into the duct 1100 may be less than 100° C., preferably, less than 50° C., and more preferably, less than 40° C., but is not limited thereto. The temperature of the first fluid discharged after passing through the duct 1100 may be higher than the temperature of the first fluid introduced into the duct 1100. Each duct 1100 has a first surface 1110, a second surface 1120 facing the first surface 1100 and disposed parallel to the first surface 1110, a third surface 1130 disposed between the first surface 1100 and the second surface 1120, a fourth surface 1140 disposed to be perpendicular to the third surface 1130 between the first surface 1100 and the second surface 1120, a fifth surface 1150 disposed to face the third surface 1130, and a sixth surface 1160 disposed to face the fourth surface 1140, and the first fluid passes through the inside of the duct. When the first thermoelectric module 1200 and the second thermoelectric module 1300 are disposed on the first surface 1100 and the second surface 1120 of the duct 1100, respectively, the third surface 1130 may be a surface disposed in a direction in which the second fluid is introduced, and the fourth surface 1140 may be a surface disposed in a direction in which the first fluid is introduced and discharged. To this end, a first fluid inlet 1142 and a first fluid outlet 1144 may be formed on the fourth surface 1140 of the duct 1100. The first fluid inlet 1142 and the first fluid outlet 1144 may be connected to a fluid receiving part within the duct 1100. Accordingly, the first fluid introduced from the first fluid inlet 1142 may be discharged from the first fluid outlet 1144 after passing through the fluid receiving part.

Although not shown, a heat dissipation fin may be disposed on an inner wall of the duct 1100. The shape and number of the heat dissipation fins, and the area of the heat dissipation fin occupying the inner wall of the duct 1100 may be variously changed depending on the temperature of the first fluid, the temperature of the waste heat, the required power generation capacity, and the like. The area of the heat dissipation fin occupying the inner wall of the duct 1100 may be, for example, 1 to 40% of a cross-sectional area of the duct 1100. Accordingly, it is possible to obtain high thermoelectric conversion efficiency without interfering with the flow of the first fluid. At this time, the heat dissipation fin may have a shape that does not interfere with the flow of the first fluid. For example, the heat dissipation fin may be formed in a direction in which the first fluid flows. In other words, the heat dissipation fin may have a plate shape extending in a direction from the first fluid inlet toward the first fluid outlet, and the plurality of heat dissipation fins may be disposed to be spaced apart from each other by a predetermined interval. The heat dissipation fin may be formed integrally with the inner wall of the duct 1100.

In the embodiment of the present invention, the direction of the second fluid flowing through the fluid passing part 2200 and the introduction/discharge directions of the first fluid flowing through the duct 1100 may be different. For example, the introduction/discharge directions of the first fluid and the passing direction of the second fluid may be different by about 90°. Accordingly, it is possible to obtain uniform heat conversion performance in the entire area.

Meanwhile, the first thermoelectric module 1200 may be disposed on the first surface 1100 of the duct 1100, and the second thermoelectric module 1300 may be disposed to be symmetrical to the first thermoelectric module 1200 on the second surface 1120 of the duct 1100.

The first thermoelectric module 1200 and the second thermoelectric module 1300 may be fastened to the duct 1100 using a screw or a coil spring. Accordingly, the first thermoelectric module 1200 and the second thermoelectric module 1300 may be stably coupled to the surface of the duct 1100. Alternatively, at least one of the first thermoelectric module 1200 and the second thermoelectric module 1300 may also be bonded to the surface of the duct 1100 using a thermal interface material (TIM). By using the coil spring, the thermal interface material (TIM), and/or the screw, it is possible to uniformly control the uniformity of heat applied to the first thermoelectric module 1200 and the second thermoelectric module 1300 even at a high temperature.

Meanwhile, as shown in FIG. 7A, each of the first thermoelectric module 1200 and the second thermoelectric module 1300 includes thermoelectric elements 1210 and 1310 disposed on each of the first surface 1100 and the second surface 1120 and the heat sinks 1220 and 1320 disposed on the thermoelectric elements 1210 and 1310. As described above, the duct 1100 through which the first fluid flows is disposed on one surface of both surfaces of each of the thermoelectric elements 1210 and 1310, and the heat sinks 1220 and 1320 are disposed on the other surface thereof, and when the second fluid passes through the heat sinks 1220 and 1320, it is possible to increase the temperature difference between heat absorption surfaces and heat dissipation surfaces of the thermoelectric elements 1210 and 1310, thereby increasing the thermoelectric conversion efficiency. At this time, when the direction from the first surface 1100 toward the thermoelectric element 1210 and the heat sink 1220 is defined as a first direction, a length in the first direction of the heat sink 1220 may be longer than a length in the first direction of the thermoelectric element 1210. Accordingly, since a contact area between the second fluid and the heat sink 1220 is increased, a temperature of the heat absorption surface of the thermoelectric element 1210 may be increased.

At this time, referring to FIG. 7B, the heat sinks 1220 and 1320 and the thermoelectric elements 1210 and 1310 may be fastened by a plurality of fastening members 1230 and 1330. Here, the fastening members 1230 and 1330 may be the coil spring or the screw. To this end, at least some of the heat dissipation fins 1220 and 1320 and the thermoelectric elements 1210 and 1310 may have through holes S through which the fastening members 1230 and 1330 pass. Here, separate insulators 1240 and 1340 may be further disposed between the through holes S and the fastening members 1230 and 1330. The separate insulators 1240 and 1340 may be insulators surrounding outer circumferential surfaces of the fastening members 1230 and 1330 or insulators surrounding wall surfaces of the through holes S. For example, the insulators 1240 and 1340 may have a ring shape. Inner circumferential surfaces of the insulators 1240 and 1340 having the ring shape may be disposed on the outer circumferential surfaces of the fastening members 1230 and 1330, and outer circumferential surfaces of the insulators 1240 and 1340 may be disposed on inner circumferential surfaces of the through holes S. Accordingly, the fastening members 1230 and 1330 and the heat sinks 1220 and 1320 and the thermoelectric elements 1210 and 1310 may be insulated.

At this time, the structures of the thermoelectric elements 1210 and 1310 may have the structure of a thermoelectric element 100 shown in FIGS. 8 and 9. Referring to FIGS. 8 and 9, the thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, a plurality of P-type thermoelectric legs 130 and a plurality of N-type thermoelectric legs 140 are electrically connected by the lower electrode 120 and the upper electrode 150. A pair of P-type thermoelectric leg 130 and N-type thermoelectric leg 140 disposed between the lower electrode 120 and the upper electrode 150 and electrically connected to each other may form a unit cell.

For example, when a voltage is applied to the lower electrode 120 and the upper electrode 150 through lead wires 181 and 182, a substrate in which current flows from the P-type thermoelectric leg 130 to the N-type thermoelectric leg 140 due to the Peltier effect may function as a cooling unit by absorbing heat, and a substrate in which current flows from the N-type thermoelectric leg 140 to the P-type thermoelectric leg 130 may function as a heat-generation part by being heated. Alternatively, when a temperature difference between the lower electrode 120 and the upper electrode 150 is applied, charges in the P-type thermoelectric leg 130 and the N-type thermoelectric leg 140 move due to the Seebeck effect, and electricity may also be generated.

Here, the P-type thermoelectric leg 130 and the N-type thermoelectric leg 140 may be bismuth telluride (Bi—Te)-based thermoelectric legs including bismuth (Bi) and tellurium (Te) as main raw materials. The P-type thermoelectric leg 130 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain 99 to 99.999 wt % of Bi—Sb—Te, which is a main raw material, and contain 0.001 to 1 wt % of at least one of nickel (Ni), aluminum (Al), copper (Cu), silver (Ag), lead (Pb), boron (B), gallium (Ga), and indium (In) based on 100 wt % of the total weight. The N-type thermoelectric leg 140 may be a bismuth telluride (Bi—Te)-based thermoelectric leg containing at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain 99 to 99.999 wt % of Bi—Se—Te, which is a main raw material, and contain 0.001 to 1 wt % of at least one of nickel (Ni), aluminum (Al), copper (Cu), silver (Ag), lead (Pb), boron (B), gallium (Ga), and indium (In) based on 100 wt % of the total weight.

The P-type thermoelectric leg 130 and the N-type thermoelectric leg 140 may be formed in a bulk type or a stack type. In general, the bulk-type P-type thermoelectric leg 130 or the bulk-type N-type thermoelectric leg 140 may be obtained through a process of manufacturing an ingot by heat-treating a thermoelectric material, acquiring a powder for the thermoelectric leg by grinding and sieving the ingot, and sintering the powder for the thermoelectric leg and cutting a sintered body. At this time, the P-type thermoelectric leg 130 and the N-type thermoelectric leg 140 may be polycrystalline thermoelectric legs. As described above, when the P-type thermoelectric leg 130 and the N-type thermoelectric leg 140 are polycrystalline thermoelectric legs, strengths of the P-type thermoelectric leg 130 and the N-type thermoelectric leg 140 may be increased. The stack type P-type thermoelectric leg 130 or the stack type N-type thermoelectric leg 140 may be obtained through a process of forming a unit member by applying a paste including a thermoelectric material on a sheet-shaped base material, and then stacking and cutting the unit member.

At this time, the pair of P-type thermoelectric leg 130 and N-type thermoelectric leg 140 may have the same shape and volume, or different shapes and volumes. For example, since electrical conductivity characteristics of the P-type thermoelectric leg 130 and the N-type thermoelectric leg 140 are different, a height or cross-sectional area of the N-type thermoelectric leg 140 may also be formed differently from a height or cross-sectional area of the P-type thermoelectric leg 130.

At this time, the P-type thermoelectric leg 130 or the N-type thermoelectric leg 140 may have a cylindrical shape, a polygonal column shape, an elliptical column shape, or the like.

The performance of the thermoelectric element according to the embodiment of the present invention may be represented as a figure of merit (ZT). The figure of merit (ZT) may be represented as in Equation 1.

$$ZT = \alpha^2 \cdot \sigma \cdot T/k \qquad \text{[Equation 1]}$$

where α refers to a Seebeck coefficient [V/K], σ refers to the electrical conductivity [S/m], and $\alpha^2\sigma$ refers to a power factor [W/mK²]. In addition, T refers to a temperature, and k refers to the thermal conductivity [W/mK]. k may be represented as a·p·ρ, a refers to the thermal diffusivity [cm²/S], cp refers to the specific heat [J/gK], and ρ refers to a density [g/cm³].

To obtain the figure of merit of the thermoelectric element, a Z value (V/K) may be measured by using a Z meter, and the figure of merit (ZT) may be calculated by using the measured Z value.

Here, the lower electrode 120 disposed between the lower substrate 110 and the P-type thermoelectric leg 130 and the N-type thermoelectric leg 140, and the upper electrode 150 disposed between the upper substrate 160 and the P-type thermoelectric leg 130 and the N-type thermoelectric leg 140 may contain at least one of copper (Cu), silver (Ag), aluminum (Al), and nickel (Ni), and have a thickness of 0.01 mm to 0.3 mm. When the thickness of the lower electrode 120 or the upper electrode 150 is less than 0.01 mm, a function as an electrode may be degraded, thereby reducing the electrical conduction performance, and when the thickness thereof exceeds 0.3 mm, conduction efficiency may be reduced due to an increase in resistance.

In addition, the lower substrate 110 and the upper substrate 160 facing each other may be metal substrates, and the thickness thereof may be 0.1 mm to 1.5 mm. When the thickness of the metal substrate is less than 0.1 mm or exceeds 1.5 mm, heat dissipation characteristics or thermal conductivity may be excessively increased, thereby reducing the reliability of the thermoelectric element. In addition, when the lower substrate 110 and the upper substrate 160 are the metal substrates, insulating layers 170 may be further formed between the lower substrate 110 and the lower electrode 120 and between the upper substrate 160 and the upper electrode 150, respectively. The insulating layer 170 may include a material having a thermal conductivity of 1 to 20 W/mK. At this time, the insulating layer 170 may be a resin composition containing at least one of an epoxy resin and a silicon resin and an inorganic material, a layer made of a silicon composite containing silicon and an inorganic material, or an aluminum oxide layer. Here, the inorganic material may be at least one of oxide, nitride, and carbide of aluminum, boron, or silicon.

At this time, the sizes of the lower substrate 110 and the upper substrate 160 may also be differently formed. In other words, the volume, thickness, or area of one of the lower substrate 110 and the upper substrate 160 may be formed greater than the volume, thickness, or area of the other. Here, the thickness may be a thickness in a direction from the lower substrate 110 to the upper substrate 160, and the area may be an area in a direction perpendicular to a direction from the substrate 110 to the upper substrate 160. Accordingly, it is possible to improve heat absorption performance or heat dissipation performance of the thermoelectric element. Preferably, the volume, thickness, or area of the lower substrate 110 may be formed greater than at least one of the volume, thickness, and area of the upper substrate 160. At this time, at least one of the volume, thickness, or the area of the lower substrate 110 may be greater than that of the upper substrate 160 when the lower substrate 110 is disposed in a high temperature area for the Seebeck effect, when the lower substrate 110 is applied to a heat-generation area for the Peltier effect, or when a sealing member configured to protect the thermoelectric element from external environments to be described below is disposed on the lower substrate 110. At this time, the area of the lower substrate 110 may be formed in a range of 1.2 to 5 times the area of the upper substrate 160. When the area of the lower substrate 110 is formed to be less than 1.2 times that of the upper substrate 160, the influence on the improvement of heat transfer efficiency is not high, and when the area of the lower substrate 110 exceeds 5 times, the heat transfer efficiency is rather reduced significantly, and it may be difficult to maintain the basic shape of the thermoelectric module.

In addition, a heat dissipation pattern, for example, an uneven pattern, may also be formed on the surface of at least one of the lower substrate 110 and the upper substrate 160. Accordingly, it is possible to improve the heat dissipation performance of the thermoelectric element. When the uneven pattern is formed on a surface coming into contact with the P-type thermoelectric leg 130 or the N-type thermoelectric leg 140, bonding characteristics between the thermoelectric leg and the substrate may also be improved. The thermoelectric element 100 includes the lower substrate 110, the lower electrode 120, the P-type thermoelectric leg 130, the N-type thermoelectric leg 140, the upper electrode 150, and the upper substrate 160.

Although not shown, a sealing member may be further disposed between the lower substrate 110 and the upper substrate 160. The sealing member may be disposed on side surfaces of the lower electrode 120, the P-type thermoelectric leg 130, the N-type thermoelectric leg 140, and the upper electrode 150 between the lower substrate 110 and the upper substrate 160. Accordingly, the lower electrode 120, the P-type thermoelectric leg 130, the N-type thermoelectric leg 140, and the upper electrode 150 may be sealed from external moisture, heat, contamination, and the like.

At this time, the lower substrate 110 disposed on the duct 1100 may be an aluminum substrate, and the aluminum substrate may be bonded to each of the first surface 1100 and the second surface 1120 by the thermal interface material (TIM). Since the aluminum substrate has excellent heat interface performance, the heat transfer between one surface of both surfaces of each of the thermoelectric elements 1210 and 1310 and the duct 1100 through which the first fluid flows is easy. In addition, when the aluminum substrate and the duct 1100 through which the first fluid flows are bonded by the thermal interface material (TIM), the heat transfer between the aluminum substrate and the duct 1100 through which the first fluid flows may not be interrupted. Here, the thermal interface material (TIM) is a material having heat transfer performance and bonding performance, and may be, for example, a resin composition containing at least one of an epoxy resin and a silicon resin and an inorganic material. Here, the inorganic material may be oxide, carbide, or nitride of aluminum, boron, or silicon.

Referring back to FIGS. 3 to 7, in order to increase the sealing and heat insulation effect between the first thermoelectric module 1200, the duct 1100, and the second thermoelectric module 1300, the power generation module according to the embodiment of the present invention may further include the shield member 1600 and the heat insulating member 1700. The heat insulating member 1700 may be disposed, for example, on a surface of the surfaces of the duct 1100 that excludes areas where the first thermoelectric module 1200 and the second thermoelectric module 1300 are disposed. Accordingly, it is possible to prevent heat loss of the first fluid and the second fluid, and enhance the power generation performance by increasing the temperature difference between the low temperature part and the high temperature part of each of the first thermoelectric module 1200 and the second thermoelectric module 1300. In addition, the shield member 1600 may be disposed on the surface of the surfaces of the duct 1100 that excludes the area where the first thermoelectric module 1200 and the second thermoelectric module 1300 are disposed. Wires and connectors connected to the first thermoelectric module 1200 and the second thermoelectric module 1300 may be protected from external moisture or contamination.

Meanwhile, the guide plate 1800 is a plate for guiding the flow of the second fluid in the fluid passing part 2200, and the second fluid introduced into the fluid passing part 2200 may flow along the guide plate 1800 and then may be discharged.

A first guide plate 1800-1 may be disposed to face the first thermoelectric module 1200, a second guide plate 1800-2 may be disposed to face the second thermoelectric module 1300, and the second fluid may pass between the first thermoelectric module 1200 and the first guide plate 1800-1 and between the second thermoelectric module 1300 and the second guide plate 1800-2.

At this time, both sides of the guide plates 1800-1 and 1800-2 may extend to fluid collection plates 1810-1 and 1810-2 and fluid diffusion plates 1820-1 and 1820-2, respectively. The fluid collection plates 1810-1 and 1810-2 may mean plates extending toward the inlet of the fluid passing part 2200, that is, the first connection part 2400, and the fluid diffusion plates 1820-1 and 1820-2 may mean plates extending toward the outlet of the fluid passing part 2200, that is, the second connection part 2500. At this time, the fluid collection plates 1810-1 and 1810-2, the guide plates 1800-1 and 1800-2, and the fluid diffusion plates 1820-1 and 1820-2 may be integrally connected plates. The first guide plate 1800-1 disposed to face the first thermoelectric module 1200 and the second guide plate 1800-2 disposed to face the second thermoelectric module 1300 may be disposed symmetrically while maintaining a constant distance d3. Here, a distance d3 between the first guide plate 1800-1 and the second guide plate 1800-2 may be a distance in a horizontal from the first guide plate 1800-1 toward the second guide plate 1800-2. Accordingly, the second fluid may pass between the first thermoelectric module 1200 and the first guide plate 1800-1 and between the second thermoelectric module 1300 and the second guide plate 1800-2 at a constant flow rate, thereby obtaining uniform thermoelectric performance. In contrast, distances d4 and d4' between the first fluid collection plate 1810-1 extending from the first guide plate 1800-1 and the second fluid collection plate 1810-2 extending from the second guide plate 1800-2 may be symmetrically disposed to be farther away as it approaches the inlet of the fluid passing part 2200. Here, the distance between the first fluid collection plate 1810-1 and the second fluid collection plate 1810-2 may be a distance in a horizontal direction from the first fluid collection plate 1810-1 toward the second fluid collection plate 1810-2. Likewise, the distance between the first fluid diffusion plate 1820-1 extending from the first guide plate 1800-1 and the second fluid diffusion plate 1820-2 extending from the second guide plate 1800-2 may also be symmetrically disposed to be farther away as it approaches the outlet of the fluid passing part 2200. Accordingly, the second fluid introduced through the inlet of the fluid passing part 2200 may be collected in the fluid collection plates 1810-1 and 1810-2 and then may pass between the thermoelectric modules 1200 and 1300 and the guide plate 1800, and may be diffused from the fluid diffusion plates 1820-1 and 1820-2 and then may be discharged through the outlet of the fluid passing part 2200. Accordingly, since a pressure difference between the second fluids before and after the second fluid passes between the thermoelectric modules 1200 and 1300 and the guide plate 1800 may be minimized, it is possible to prevent a problem of the second fluid backflowing toward the inlet of the fluid passing part 2200.

At this time, the support frame 1900 supports the first guide plate 1800-1 and the second guide plate 1800-2, the first fluid collection plate 1810-1 and the second fluid collection plate 1810-2, and the first fluid diffusion plate 1820-1 and the and second fluid diffusion plate 1820-2. In other words, the support frame 1900 includes a first support frame 1900-1 and a second support frame 1900-2, and the first guide plate 1800-1 and the second guide plate 1800-2, the first fluid collection plate 1810-1 and the second fluid collection plate 1810-2, and the first fluid diffusion plate 1820-1 and the and second fluid diffusion plate 1820-2 may be fixed between the first support frame 1900-1 and the second support frame 1900-2.

Meanwhile, in the embodiment of the present invention, the branch unit 1400 may branch the second fluid introduced into the fluid passing part 2200. The second fluid branched by the branch unit 1400 may pass between the first thermoelectric module 1200 and the first guide plate 1800-1 and between the second thermoelectric module 1300 and the second guide plate 1800-2.

The branch unit 1400 may be disposed between the first surface 1100 and the second surface 1120 of the duct 1100. For example, when the third surface 1130 of the duct 1100 is disposed in a direction in which the second fluid flows, the branch unit 1400 may be disposed on the third surface 1130 of the duct 1100. Alternatively, the branch unit 1400 may also be disposed on the fifth surface 1150 opposite to the third surface 1130 of the duct 1100 by a hydrodynamic principle.

The branch unit 1400 may have a shape in which a distance from the third surface 1130 increases from both ends of the third surface 1130 toward a center between both ends of the third surface 1130 on the third surface 1130 of the duct 1100. In other words, the third surface 1130 on which the branch unit 1130 may be substantially perpendicular to the first surface 1100 and the second surface 1120, and the branch unit 1400 may be disposed to be inclined with respect to the first surface 1100 and the second surface 1120 of the duct 1100. For example, the branch unit 1400 may have an umbrella shape or a roof shape. Accordingly, the second fluid, for example, waste heat, may be branched through the branch unit 1400, and guided to come into contact with the first thermoelectric module 1200 and the second thermoelectric module 1300 disposed on both surfaces of the power generation apparatus. In other words, the second fluid may be branched through the branch unit 1400 to pass between the first thermoelectric module 1200 and the first guide plate 1800-1 and between the second thermoelectric module 1300 and the second guide plate 1800-2.

Meanwhile, a width W1 between an outside of the first heat sink 1220 of the first thermoelectric module 1200 and an outside of the second heat sink 1320 of the second thermoelectric module 1300 may be greater than a width W2 of the branch unit 1400. Here, each of the outside of the first heat sink 1220 and the outside of the second heat sink 1320 may mean an opposite side of the side facing the duct 1100. Here, each of the first heat sink 1220 and the second heat sink 1320 may include a plurality of heat dissipation fins, and the plurality of heat dissipation fins may be formed in a direction that does not interfere with the flow of gas. For example, the plurality of heat dissipation fins may have a plate shape extending in a second direction in which the gas flows. Alternatively, the plurality of heat dissipation fins may also have a shape that is folded so that a flow path is formed in the second direction in which the gas flows. At this time, the maximum width W1 between the first heat sink 1220 of the first thermoelectric module 1200 and the second heat sink 1320 of the second thermoelectric module 1300 may mean a distance from the farthest point of the first heat sink 1220 to the farthest point of the second heat sink 1320 with respect to the duct 1100, and the maximum width W2 of the branch unit 1400 may mean the width of the branch unit 1400 in an area closest to the third surface 1130 of the duct 1100. Accordingly, the flow of the second fluid may be directly transmitted to the first heat sink 1220 and the second heat sink 1320 without being interrupted by the branch unit 1400. Accordingly, the contact area between the second fluid and the first heat sink 1220 and the second heat sink 1320 is increased, so that an amount of heat received by the first heat sink 1220 and the second heat sink 1320 from the second fluid may increase, and the power generation efficiency may be increased.

Meanwhile, the first guide plate 1800-1 may be symmetrically disposed to be spaced apart from the first heat sink 1220 of the first thermoelectric module 1200 by a predetermined interval, and the second guide plate 1800-2 may be symmetrically disposed to be spaced apart from the second heat sink 1320 of the second thermoelectric module 1300 by a predetermined interval. Here, intervals between the guide plates 1800-1 and 1800-2 and the heat sink of each thermoelectric module may affect the pressure difference before and after the second fluid coming into contact with the heat sink of each thermoelectric module passes through the heat sink, thereby affecting power generation performance.

In an embodiment of the present invention, the intervals between the guide plates 1800-1 and 1800-2 and the heat sink of each thermoelectric module is intended to be maintained at an interval which is required for optimizing power generation performance.

FIGS. 10A and 10B are partial cross-sectional views of the power generation apparatus according to one embodiment of the present invention.

Referring to FIGS. 10A and 10B, a ratio of the shortest horizontal distance d2 between the heat sinks 1220 and 1320 and the guide plates 1800-1 and 1800-2 to the shortest horizontal distance d1 between the branch unit 1400 and the guide plates 1800-1 and 1800-2 may be 0.0625 to 0.25, and preferably, 0.0625 to 0.167. Here, the horizontal direction may be defined as a direction from the first guide plate 1800-1 toward the second guide plate 1800-2. As shown in FIG. 10B, when the guide plates 1800-1 and 1800-2 are not disposed in the horizontal direction of the branch unit 1400 and the fluid collection plates 1810-1 and 1810-2 are disposed in the horizontal direction of the branch unit 1400, that is, when the first fluid collection plates 1810-1, the branch unit 1400, and the second fluid collection plate 1810-2 are sequentially disposed in the horizontal direction and a boundary between the first fluid collection plate 1810-1 and the first guide plate 1800-1 and a boundary between the second fluid collection plate 1810-2 and the second guide plate 1800-2 are disposed in the horizontal direction on the first surface 1100 and the second surface 1120 between the branch unit 1400 and the thermoelectric modules 1200 and 1300, the shortest horizontal distance d1 between the branch unit 1400 and the guide plates 1800-1 and 1800-2 may mean the shortest horizontal distance between virtual extension surfaces 1800-E1 and 1800-E2 of the guide plates 1800-1 and 1800-2 facing the thermoelectric modules 1200 and 1300 and the branch unit 1400.

To satisfy these conditions, the ratio of the shortest distance d2 between the heat sinks 1220 and 1320 and the guide plates 1800-1 and 1800-2 to the shortest distance d1 between the branch unit 1400 and the guide plates 1800-1 and 1800-2 may be 0.25 or less, preferably, 0.0625 to 0.25, and more preferably, 0.0625 to 0.167.

For example, horizontal lengths of the heat sinks 1220 and 1320 may be 6.5 to 15 mm. In addition, the shortest horizontal distance d2 between the heat sinks 1220 and 1320 and the guide plates 1800-1 and 1800-2 may be 5 mm or less, preferably, 1 to 5 mm, and more preferably, 1 to 3 mm. Accordingly, the shortest horizontal distance between the branch unit 1400 and the guide plates 1800-1 and 1800-2 may be 6.5 to 20 mm.

For example, when the length of the first heat sink 1220 is 15 mm, the shortest distance d1 between the first heat sink 1220 and the first guide plate 1800-1 may be 5 mm or less, preferably, 1 to 5 mm, and more preferably, 1 to 3 mm. Accordingly, it is possible to minimize the pressure difference of the second fluid before and after the second fluid passes through the thermoelectric modules 1200 and 1300, and optimize a flow space of the second fluid. Accordingly, the contact areas between the second fluid and the heat sinks 1220 and 1320 of the thermoelectric modules 1200 and 1300 may be maximized to increase the temperature difference between the high temperature parts and the low temperature parts of the thermoelectric modules 1200 and 1300, and as a result, it is possible to enhance power generation performance.

Meanwhile, in one embodiment of the present invention, in order to maintain the ratio of the shortest distance d2 between the heat sinks 1220 and 1320 and the guide plates 1800-1 and 1800-2 to the shortest distance d1 between the branch unit 1400 and the guide plates 1800-1 and 1800-2 as 0.25 or less, preferably, 0.0625 to 0.25, and more preferably, 0.0625 to 0.167, the power generation apparatus may further include a separation member 1500 configured to separate the duct 1100 and the guide plates 1800-1 and 1800-2.

FIG. 11 is a plan view of the power generation apparatus according to one embodiment of the present invention.

Referring to FIG. 11, the separation member 1500 may separate the guide plates 1800-1 and 1800-2 and the duct 1100 by a predetermined interval by coming into contact with the guide plates 1800-1 and 1800-2 and the duct 1100. Here, the contact may mean not only direct contact, but also indirect contact through another medium.

In the embodiment of the present invention, the separation member 1500 may be disposed between the first surface 1100 and the second surface 1120 of the duct 1100. When the branch unit 1400 is disposed on the third surface 1130 between the first surface 1100 and the second surface 1120 of the duct 1100, the separation member 1500 may be disposed on the fourth surface 1140 disposed perpendicular to the third surface 1130 between the first surface 1100 and the second surface 1120 of the duct 1100.

Here, the third surface 1130 on which the branch unit 1400 is disposed may be a surface disposed in a direction into which the second fluid is introduced, and the fourth surface 1140 on which the separation member 1500 is disposed may be a surface disposed in a direction into which the first fluid is introduced.

In one embodiment of the present invention, the separation member 1500 separates a horizontal distance between the first surface 1100 of the duct 1100 and the first guide plate 1800-1 and a horizontal distance between the second surface 1120 of the duct 1100 and the second guide plate 1800-2 by a predetermined distance. Accordingly, the horizontal distance between the first heat sink 1220 of the first thermoelectric module 1200 and the first guide plate 1800-1 and the horizontal distance between the second heat sink 1320 of the second thermoelectric module 1300 and the second guide plate 1800-2 may be separated by a predetermined distance. At this time, the separation member 1500 may include a heat insulating material. Accordingly, it is possible to thermally insulate between the second fluid flowing along the guide plates 1800-1 and 1800-2 and the first fluid flowing in the duct 1100.

To this end, the separation member 1500 may include a first region 1510 disposed on the fourth surface 1140 perpendicular to the third surface 1130 of the duct 1100 on which the branch unit 1400 is disposed, a second region 1520 extending from the first region 1510 toward the first surface 1110, and a third region 1530 extending from the first region 1510 toward the second surface 1120. At this time, a first face 1522 of the second region 1520 may be disposed on the first surface 1110, and a second face 1524 of the second region 1520 may be disposed on the first guide plate 1800-1. In addition, a first face 1532 of the third region 1530 may be disposed on the second surface 1120, and a second face 1534 of the third region 1530 may be disposed on the second guide plate 1800-2. Accordingly, since the first surface 1100 of the duct 1100 and the first guide plate 1800-1 may be separated by a distance T between the first face 1522 and the second face 1524 of the second region 1520, the second surface 1120 of the duct 1100 and the second guide plate 1800-2 may be separated by the distance T between a first face 1532 and a second face 1534 of the third region 1530, and the heat sink and the guide plate may maintain a predetermined distance t, it is possible to optimize the pressure difference of the second fluid and the flow space of the second fluid. In this specification, the pressure difference of the second fluid may mean the pressure difference of the second fluid before and after the second fluid passes through the heat sink of the thermoelectric module. When the length of the heat sink is l, the sum of the length l of the heat sink and the distance t between the heat sink and the guide plate may be equal to the distance T between the first face 1522 and the second face 1524 of the second region of the separation member 1500 or the distance T between the first face 1532 and the second face 1534 of the third region of the separation member 1500, that is, the distance between the duct 1100 and the guide plate 1800.

Hereinafter, a simulation result of the performance according to the length l of the heat sink and the distance t between the heat sink and the guide plate in the power generation apparatus according to the embodiment of the present invention will be described.

Table 1 shows the temperature difference of the thermoelectric element according to the length of the heat sink and the distance between the heat sink and the guide plate, and the pressure difference of the second fluid before and after the second fluid passes through the heat sink of the thermoelectric module, FIG. 12A shows the relationship between the distance t (mm) between the heat sink and the guide plate with respect to the length l of the heat sink and the temperature difference DT (K) of the thermoelectric element, FIG. 12B shows the relationship between the distance t (mm) between the heat sink and the guide plate with respect to the length l of the heat sink and the pressure difference DP (mmH$_2$O) of the second fluid, and FIG. 12C shows the relationship of the distance t (mm) between the heat sink and the guide plate by correcting the temperature difference DT (K) of the thermoelectric element and the pressure difference DP (mmH$_2$O) of the second fluid.

TABLE 1

| No. | Distance t (mm) between heat sink and guide plate | Temperature difference DT (K)/length 1 (mm) of heat sink | Pressure difference DP (mmH$_2$O)/ length 1 (mm) of heat sink |
|---|---|---|---|
| 1 | 0 | 121.93/15 | 70.96/15 |
| 2 | 1 | 121.34/15 | 61.98/15 |
| 3 | 2 | 120.44/15 | 52.16/15 |
| 4 | 3 | 118.92/15 | 43.76/15 |
| 5 | 5 | 116.44/15 | 32.60/15 |
| 6 | 34.6 | 102.93/15 | 11.41/15 |
| 7 | 2 | 103.46/6.5 | 74.23/6.5 |

Referring to Table 1 and FIGS. 12A to 12C, comparing No. 3 with No. 7, it can be seen that as the length of the heat sink increases, the contact area of the second fluid increases, so that the temperature difference between the high temperature part and the low temperature part of the thermoelectric element increases. In addition, comparing Nos. 1 to 5 with No. 6, it can be seen that when the guide plate exists, the contact area between the heat sink and the second fluid increases, so that the temperature difference between the high temperature part and the low temperature part of the thermoelectric element increases, but in No. 6 in which the function of the guide plate is not performed because the distance between the heat sink and the guide plate increases, the temperature difference between the high temperature part and the low temperature part of the thermoelectric element is very small. In addition, comparing Nos. 1 to 5, it can be seen that as the distance between the heat sink and the guide plate increases, the temperature difference between the high temperature part and the low temperature part of the thermoelectric element decreases, and the pressure difference of the second fluid before and after the second fluid passes through the thermoelectric module decreases. However, power generation performance is proportional to the temperature difference of the thermoelectric element and inversely proportional to the pressure difference of the second fluid. Accordingly, in order to find the distance between the heat sink and the guide plate that optimizes power generation performance, a graph in FIG. 12C was derived by converting the temperature difference of the thermoelectric element and the pressure difference of the second fluid into an inverse relationship, and correcting the temperature difference and the pressure difference to have a displacement at a certain rate for simultaneous comparison. Accordingly, it can be seen that the sum of two values has a high value when the distance between the heat sink and the guide plate is 1 to 3 mm.

Meanwhile, although it has been described above that one power generation apparatus is disposed with respect to one pair of guide plates, the present invention is not limited thereto. A plurality of power generation apparatuses may be disposed between the pair of guide plates.

FIG. 13 shows a power generation system according to another embodiment of the present invention.

Referring to FIG. 13, a power generation system 20 according to another embodiment of the present invention includes a plurality of power generation apparatuses 1000-1, . . . , and 1000-N disposed adjacent to each other. The power generation apparatuses 1000-1, . . . , and 1000-N include cooling units 1100-1, . . . , and 1100-N, first thermoelectric modules 1200-1, . . . , and 1200-N disposed on first surfaces of the cooling units 1100-1, . . . , and 1100-N, second thermoelectric modules disposed on second surfaces of the cooling units 1100-1, . . . , and 1100-N, and separation members 1500-1, . . . , and 1500-N disposed between the first surfaces and the second surfaces of the cooling units 1100-1, . . . , and 1100-N, respectively, one of first heat sinks 1220-1, . . . , and 1220-N and second heat sinks 1320-1, . . . , and 1320-N of each of the power generation apparatuses 1000-1, . . . , and 1000-N is spaced apart from one of the first heat sinks 1220-1, . . . , and 1220-N and the second heat sinks 1320-1, . . . , and 1320-N of adjacent power generation apparatuses 1000-1, . . . , and 1000-N, and the separation members 1500-1, . . . , and 1500-N of each of the power generation apparatuses 1000-1, . . . , and 1000-N come into contact with the separation members 1500-1, . . . , and 1500-N of adjacent power generation apparatuses 1000-1, . . . , and 1000-N. At this time, the power generation system 20 may further include a first guide plate 1800-1 disposed to be spaced apart from the first heat sink 1220-1 of a first power generation apparatus 1000-1 that is one of the plurality of power generation apparatuses 1000-1, . . . , and 1000-N, and a second guide plate 1800-2 disposed to be spaced apart from the second heat sink 1320-N of a second power generation apparatus 1000-N that is another one of the plurality of power generation apparatuses 1000-1, . . . , and 1000-N, and the separation member 1500-1 of the first power generation apparatus 1000-1 may come into contact with the first guide plate 1800-1, and the separation member 1500-N of the second power generation apparatus 1000-N may come into contact with the second guide plate 1800-N. In addition, the remaining power generation apparatuses may be disposed between the first power generation apparatus 1000-1 and the second power generation apparatus 1000-N.

Meanwhile, the inside of the duct included in the power generation apparatus according to the embodiment of the present invention may have the following flow path design.

FIG. 14 is a top view of the power generation module according to one embodiment of the present invention, FIG. 15 is a cross-sectional view of a cooling unit according to one embodiment of the present invention, FIG. 16 is a cross-sectional view of a cooling unit according to another embodiment of the present invention, FIG. 17 is a cross-sectional view of a cooling unit according to still another embodiment of the present invention, and FIG. 18 is a cross-sectional view of a cooling unit according to yet another embodiment of the present invention.

Referring to FIG. 14, the power generation module according to one embodiment of the present invention includes a cooling unit 1100 and a first thermoelectric module 1200 disposed on a first surface 1100 of the cooling unit 1100. As described with reference to FIGS. 1 to 9, the cooling unit 1100 may be used interchangeably with the duct 1100 in this specification. A second thermoelectric module 1300 may be further disposed on a second surface 1120 facing the first surface 1100 of the cooling unit 1100.

A fluid inlet 1142 and a fluid outlet 1144 are disposed to be spaced apart from each other on another surface perpendicular to the first surface 1100 of the cooling unit 1100, that is, a fourth surface 1140, and a fluid receiving part 300 is disposed in one region A1 of the cooling unit 1100. In this specification, since the first thermoelectric module 1200 and the second thermoelectric module 1300 are disposed on the first surface 1100 and the second surface 1120 of the cooling unit 1100, respectively, the first surface 1100 and the second surface 1120 of the cooling unit 1100 may be referred to as one surface and the other surface of the cooling unit 1100. In addition, third to sixth surfaces 1130 to 1160 between the first surface 1100 and the second surface 1120 of the cooling unit 1100 may be referred to as side surfaces or outer surfaces of the cooling unit 1100. Alternatively, in this specification, the first surface 1100 to the sixth surface 1160 of the cooling unit 1100 may also be referred to as a first face 1100 to a sixth face 1160, respectively. The first fluid introduced into the fluid inlet 1142 may pass through the fluid receiving part 300 and then may be discharged through the fluid outlet 1144. Here, the arrangement order of the fluid inlet 1142 and the fluid outlet 1144 is not limited as shown, and the positions of the fluid inlet 1142 and the fluid outlet 1144 may also be opposite. The fluid inlet 1142 and the fluid outlet 1144 are formed to protrude from the fourth surface 1140 of the cooling unit 1100. Accordingly, in this specification, the fluid inlet 1142 and the fluid outlet 1144 may be referred to as protrusions.

In one embodiment of the present invention, the first thermoelectric module 1200 is disposed on the surface of one region A1 of the cooling unit 1100. Accordingly, the thermoelectric leg of the first thermoelectric module 1200 may be disposed in the region where the fluid receiving part 300 is disposed. The second fluid having a temperature higher than that of the first fluid passing through the cooling unit 1100 may pass through the heat sink of the thermoelectric module 1200 in a direction from the third surface 1130 of the cooling unit 110 toward the fifth surface 1150 facing the third surface 1130.

Meanwhile, a coupling member 400 may be used for coupling the cooling unit 1100 and the first thermoelectric module 1200. To symmetrically dispose the first thermoelectric module 1200 and the second thermoelectric module 1300 on both surfaces of the cooling unit 1100, the coupling member 400 may be disposed to pass through the first thermoelectric module 1200, the cooling unit 1100, and the second thermoelectric module 1300, and to this end, the cooling unit 1100 may be formed with a plurality of through holes S1 to S4 through which the coupling member 400 passes. The plurality of through holes S1 to S4 may be disposed to pass through both surfaces of the cooling unit 1100 in which the first thermoelectric module 1200 and the second thermoelectric module 1300 are disposed.

At this time, the plurality of through holes S1 to S4 may be disposed to be spaced apart from the fluid receiving part 300 in one region A1 of the cooling unit 1100 that is a region where the fluid receiving part 300 is disposed. In other words, the plurality of through holes S1 to S4 may be formed independently of the fluid receiving part 300, thereby preventing the first fluid passing through the fluid receiving part 300 from leaking to the outside through the plurality of through holes S1 to S4.

Meanwhile, a wiring part (not shown) connected to the first thermoelectric module 1200 and a shield member 1600 configured to cover the wiring part may be further disposed on the first surface 1100 of the other region A2 of the cooling unit 1100 disposed on the side surface of one region A1 of the cooling unit 1100. A coupling member 500 may be used for coupling the cooling unit 1100 and the shield member 1600, and a plurality of through holes S5 and S6 through which the coupling member 500 for coupling the cooling unit 110 and the shield member 1600 passes may be formed in the other region A2 of the cooling unit 1100. In other words, the plurality of through holes S5 and S6 may be formed outside one region A1 of the cooling unit 1100 that is a region where the fluid receiving part 300 is disposed so as not to overlap the fluid receiving part 300. At this time, the plurality of through holes S5 and S6 may be disposed in consideration of the position of the wiring part. In other words, the wiring part connected to the thermoelectric module may include a connection electrode (not shown) connected to the thermoelectric element of the thermoelectric module, a connector 600 disposed on the connection electrode, and a wire (not shown) connected to the connector 600. At this time, the plurality of through holes S5 and S6 may be disposed to avoid the position of the connector 600. Accordingly, the through hole S5 may be disposed closer to the fourth surface 1140 than the plurality of through holes S1 and S2, and the through hole S6 may be disposed closer to the sixth surface 1160 than the plurality of through holes S3 and S4.

Here, the positions and number of the plurality of through holes S1 to S6 are illustrative, and the embodiment of the present invention is not limited thereto.

Hereinafter, various embodiments related to the shape of the fluid receiving part of the cooling unit and the arrangement of the through holes will be described with reference to FIGS. 15 to 18. Hereinafter, the fluid receiving part may form a flow path from the fluid inlet 1142 to the fluid outlet 1144, and thus may also be referred to as a flow path.

Referring to FIG. 15, the fluid receiving part 300 in the cooling unit 1100 may be disposed in the region A1 of the cooling unit 1100 that is a region corresponding to the region where the thermoelectric modules 1200 and 1300 are disposed, and the first fluid introduced into the fluid inlet 1142 may pass through the fluid receiving part 300 and then may be discharged from the fluid outlet 1144.

Here, the fluid receiving part 300 does not form a separate flow path tube, and the plurality of through holes S1 to S4 may be disposed to be spaced apart from the fluid receiving part 300. Accordingly, since the region where the fluid receiving part 300 is disposed and the region where the thermoelectric modules 1200 and 1300 are disposed correspond to each other, the low temperature part of the thermoelectric module can obtain high cooling performance. In addition, since the through holes S1 to S4 are formed in the first region A1 of the cooling unit 1100, the first thermoelectric module 1200, the cooling unit 1100, and the second thermoelectric module 1300 may be directly coupled through the coupling member 400, and in addition, the through holes S1 to S4 are spaced apart from the fluid receiving part 300 and independently formed, so that it is possible to prevent a problem that the first fluid in the fluid receiving part 300 leaks to the outside through the through holes S1 to S4.

Alternatively, referring to FIGS. 16 to 18, the fluid receiving part 300 may have the form of a flow path connected from the fluid inlet 1142 to the fluid outlet 1144, and the first fluid introduced into the fluid inlet 1142 may flow along the flow path and then may be discharged through the fluid outlet 1144. As described above, when the fluid receiving part 300 has the form of the flow path, the first fluid may pass through the region A1 where the first thermoelectric module 1200 and the second thermoelectric module 1300 are disposed as a whole at a minimum flow rate according to the arrangement structure of the flow path. At this time, a diameter of the flow path may be 0.3 to 0.9 times, preferably, 0.4 to 0.8 times, and more preferably, 0.5 to 0.7 times a diameter of the fluid inlet 1142 and a diameter of the fluid outlet 1144. Accordingly, it is possible to increase the cooling performance of the thermoelectric module by increasing the flow rate of the first fluid passing through the flow path.

At this time, the flow path may be spaced apart from the plurality of through holes S1 to S4 and disposed to surround at least some of the plurality of through holes S1 to S4. Accordingly, it is possible to prevent the problem that the first fluid in the fluid receiving part 300 leaks to the outside through the through holes S1 to S4.

For example, referring to FIG. 16, the fluid receiving part 300 may include a plurality of first flow path portions 310-1, . . . , and 310-n disposed in parallel in a direction from the fluid inlet 1142 or the fluid outlet 1144 toward the flow path, that is, an X1 direction, and the plurality of first flow path portions 310-1, . . . , and 310-n disposed in parallel may be connected to each other through a plurality of bending portions 330-1, . . . , and 330-1.

Here, the plurality of first flow path portions 310-1, . . . , and 310-n may extend in the X1 direction from the fourth surface 1140 on which the fluid inlet 1142 and the fluid outlet 1144 are disposed toward the sixth surface 1160 facing the fourth surface 1140. At this time, at least one of the plurality of first flow path portions 310-1, . . . , and 310-n may be a straight portion disposed straightly in a first direction.

At this time, some of the intervals between two flow path portions disposed adjacent to each other in parallel may be different from the other intervals between the two flow path portions disposed adjacent to each other in parallel.

For example, an interval between two first flow path portions 31-1 and 310-2 disposed adjacent to each other in parallel may be a first interval d1, and an interval between two first flow path portions 310-3 and 310-4 disposed adjacent to each other in parallel may be a second interval d2 greater than the first interval d1.

Meanwhile, the through holes S1 to S4 in which the coupling member 400 is disposed may be disposed in one region between the plurality of flow path portions, and the through holes S1 to S4 in which the coupling member 400 is disposed may not be disposed in the other region between the plurality of flow path portions.

At this time, a width in an X2 direction perpendicular to the X1 direction between the two first flow path portions in the region where the through holes S1 to S4 in which the coupling member 400 is disposed are formed may be greater than a width in the X2 direction perpendicular to the X1 direction between the two first flow path portions in the region where the through holes S1 to S4 in which the coupling member 400 is disposed are not formed. In other words, at least some S1 and S4 of the plurality of through holes S1 to S4 may be disposed between two first flow path portions 310-3 and 310-4 forming the second interval d2. Accordingly, the first flow path portion 310 may be disposed to avoid the plurality of through holes S1 to S4 so as not to overlap the region where the plurality of through holes S1 to S4 are formed.

In addition, intervals between two first flow path portions 310-1 and 310-2 and two first flow path portions 310-n−1 and 310-n disposed at edges of the plurality of first flow path portions 310-1, . . . , and 310-n disposed in parallel may be the first interval d1. Accordingly, it is possible to obtain uniform thermoelectric performance in the entire region of the thermoelectric module. In particular, since the temperature of the first fluid discharged from the fluid outlet 1144 may be higher than the temperature of the first fluid introduced into the fluid inlet 1142, as the first fluid is closer to the fluid outlet 1144, the cooling performance of the first fluid may be reduced. Accordingly, when the interval between the two flow path portions disposed adjacent to each other in parallel is disposed to be narrower as the first fluid is closer to the fluid outlet 1144, it is possible to obtain uniform thermoelectric performance in the entire region of the thermoelectric module.

Referring to FIG. 17, the fluid receiving part 300 may include a plurality of second flow path portions 320-1, . . . , and 320-m disposed in parallel, and the plurality of second flow path portions 320-1, . . . , and 320-m disposed in parallel may be connected to each other through the plurality of bending portions 330-1, . . . , and 330-1.

The plurality of second flow path portions 320-1, . . . , and 320-m may be disposed parallel to the X2 direction parallel to the fourth surface 1140 on which the fluid inlet 1142 and the fluid outlet 1144 are disposed. At this time, at least one of the plurality of second flow path portions 320-1, . . . , and 320-m may be a straight portion disposed straightly in the second direction.

At this time, some of the intervals between two flow path portions disposed adjacent to each other in parallel may be different from the others of the intervals between the two flow path portions disposed adjacent to each other in parallel.

For example, the interval between two second flow path portions 320-1 and 320-2 disposed adjacent to each other in parallel may be the second interval d2, and the interval between two second flow path portions 320-m−1 and 320-m disposed adjacent to each other in parallel may be the first interval d1 narrower than the second interval d2.

Meanwhile, the through holes S1 to S4 in which the coupling member 400 is disposed may be disposed in one region between the plurality of flow path portions, and the through holes S1 to S4 in which the coupling member 400 is disposed may not be disposed in the other region between the plurality of flow path portions.

At this time, the width in the X1 direction perpendicular to the X2 direction between the two second flow path portions in the region where the through holes S1 to S4 in which the coupling member 400 is disposed are formed may be smaller than the width in the X1 direction perpendicular to the X2 direction between the two second flow path portions in the region where the through holes S1 to S4 in which the coupling member 400 is disposed are not formed. For example, as shown, the through holes S1 to S4 in which the coupling member 400 is disposed may be formed between the two flow path portions 320-1 and 320-2, and the through holes S1 to S4 in which the coupling member 400 is formed may not be formed between the two flow path portions 320-2 and 320-3. At this time, the interval between the two flow path portions 320-1 and 320-2 may be d2, and smaller than d3 that is the interval between the two flow path portions 320-2 and 320-3.

Accordingly, the flow path 320 may be disposed to avoid the plurality of through holes S1 to S4 so as not to overlap the region where the plurality of through holes S1 to S4 are formed.

In addition, as the flow path 320 is farther away from the fourth surface 1140 on which the fluid inlet 1142 and the fluid outlet 1144 are disposed, the interval between the flow path portions disposed adjacent to each other in parallel may also be narrower. For example, the interval between the two second flow path portions 320-m−1 and 320-m disposed adjacent to each other in parallel may be the first interval d1 smaller than the second interval d2. Accordingly, it is possible to obtain uniform thermoelectric performance in the entire region of the thermoelectric module. In particular, the temperature of the first fluid introduced into the fluid inlet 1142 may increase as the first fluid is farther away from the fluid inlet 1142. Accordingly, by narrowly disposing the interval between the two flow path portions adjacent to each other in parallel as the flow path is farther away from the fluid inlet 1142, it is possible to obtain uniform thermoelectric performance in the entire region of the thermoelectric module.

Meanwhile, in still another embodiment of the present invention, some of the flow paths are disposed parallel to the X1 direction, and the others are disposed parallel to the X2 direction, and this embodiment may include a plurality of serpentine curvature flow paths. When the flow path includes a plurality of curvature flow paths, a length of the flow path disposed per unit area may be increased, so that it is possible to improve the cooling performance of the low temperature part of the thermoelectric module.

Referring to FIG. 18, the cooling unit 1100 may include a first region B1, a second region B2, and a third region B3 sequentially disposed to have the same height from the fourth surface 1140 up to the sixth surface 1160 facing the fourth surface 1140. At this time, some S1 and S2 of the plurality of through holes S1 to S4 may be disposed closer to the fourth surface 1140 than the others S3 and S4, and distances between each of the through holes S1 and S2 and the fourth surface 1140 may be the same. For example, some S1 and S2 of the plurality of through holes S1 to S4 may be disposed in the first region B1, and the others S3 and S4 may be disposed in the third region B3.

Here, the coupling member 400 disposed in the plurality of through holes S1 to S4 may not overlap the flow path in a direction from the first surface 1100 of the cooling unit 1100 toward the second surface 1120. Accordingly, it is possible to prevent the problem that the first fluid flowing along the flow path leaks to the outside through the through holes S1 to S4.

At this time, the plurality of through holes S1 and S2 and the plurality of through holes S3 and S4 may overlap the flow path in the X1 direction. In addition, the plurality of through holes S5 and S6 may not overlap the flow path in the X1 direction. As described above, the plurality of through holes S5 and S6 are positioned in the region where the wiring part is disposed other than the region where the flow path is disposed, and the through hole S5 may be disposed closer to the fourth surface 1140 than the plurality of through holes S1 and S2, and the through hole S6 may be disposed closer to the sixth surface 1160 than the plurality of through holes S3 and S4 in consideration of a position of the connector of the wiring part.

Meanwhile, the cooling unit 1100 may be divided into an R1 region overlapping the flow path in the X2 direction, an R2 region positioned between the R1 region and the third surface 1130, and an R3 region positioned between the R1 region and the fifth surface 1150. As shown, a width in the X2 direction of the R3 region may be greater than a width in the X2 direction of the R2 region, and the plurality of through holes S5 and S6 in which the coupling member 500 is disposed may be formed in the R3 region. In other words, the horizontal distance between the flow path and the fifth surface 1150 may be greater than the horizontal distance between the flow path and the third surface 1130, and accordingly, the wiring part including a connector C may be disposed in the R3 region, and the fluid inlet 1142 and the fluid outlet 1144 may be disposed so as not to overlap the plurality of through holes S5 and S6 in the X1 direction.

The flow path includes the plurality of first flow paths 310-1, . . . , and 310-n disposed parallel to the X1 direction, the plurality of second flow paths 320-1, . . . , and 320-m disposed parallel to the X2 direction perpendicular to the X1 direction, and the plurality of bending portions 330-1, . . . , and 330-1 configured to connect one of the plurality of first flow paths 310-1, ..., and 310-*n* and one of the plurality of second flow paths 320-1, ..., and 320-*m*, connect the plurality of first flow paths 310-1, ..., and 310-*n*, or connect the plurality of second flow paths 320-1, ..., and 320-*m* in the R1 region of the cooling unit 1100, and may further include the serpentine flow path. The flow paths disposed in the X1 direction and the flow paths disposed in the X2 direction may also be alternately disposed to form a spiral shape.

As shown in FIG. 18, in the embodiment of the present invention, the first fluid circulating between the fluid inlet 1142 and the fluid outlet 1144 of the cooling unit 1100 may have a spiral shape. In other words, the flow path may include a first spiral flow path extending from one of the fluid inlet 1142 and the fluid outlet 1144 of the cooling unit 1100 toward a center portion C of the cooling unit 1100, and a second spiral flow path extending from the center portion C toward the other of the fluid inlet 1142 and the fluid outlet 1144 of the cooling unit 1100. At this time, a third flow path portion 340 disposed adjacent to the fourth surface 1140 and having an irregular flow path and a fourth flow path portion 350 disposed adjacent to the center portion C of the cooling unit 1100 and having a regular period may be included in the first spiral flow path. In addition, the first spiral flow path may include a second flow path portion 320-4 extending in an X4 direction, and the second spiral flow path may include a plurality of second flow path portions 320-1, 320-2, 320-3, and 320-*m*. At this time, the second flow path portions 320-3 and 320-5 may be disposed between the second flow path portion 320-2 and the sixth surface 1160, the second flow path portion 320-1 may be disposed between the second flow path portion 320-2 and the fourth surface 1140, and the fourth flow path portion 350 may be disposed between the second flow path portion 320-1 and the second flow path portion 320-2. At this time, the plurality of through holes S3 and S4 may be disposed between the second flow path portion 320-2 and the second flow path portion 320-3.

As described above, when the flow path circulates spirally in the region where the thermoelectric leg of the thermoelectric module is disposed in the cooling unit, and the third flow path portion 340 and the fourth flow path portion 350 having curvatures are disposed as in the embodiment of the present invention, it is possible to maximize the cooling performance of the low temperature part of the thermoelectric module.

More specifically, in the embodiment of the present invention, the flow path may include the third flow path portion 340 that is a plurality of curvature flow paths that extend serpentinely along the X2 direction. The third flow path portion 340 may be disposed between the plurality of through holes S1 and S3 and the fluid inlet 1142 and the fluid outlet 1144, and may be referred to as a bent portion. The total length l of the third flow path portion 340 may be greater than a straight distance l' in the X2 direction in the region where the third flow path portion 340 is disposed. The third flow path portion 340 may be disposed in the first region B1 of the cooling unit 1100.

The first region B1 is a region closest to the fluid inlet 1142 and the fluid outlet 1144 among the first region B1 to the third region B3. The first fluid introduced into the fluid inlet 1142 may be introduced into the fluid receiving part 300 in the X1 direction, and the first fluid circulating in the fluid receiving part 300 may be discharged from the fluid outlet 1144 in the X2 direction that is the opposite direction to the X1 direction. Accordingly, when the flow path is not separately disposed between the fluid inlet 1142 and the fluid outlet 1144 in the first region B1, a dead zone in which the first fluid does not reach may occur.

To solve this problem, as in the embodiment of the present invention, when the third flow path portion 340 that is the plurality of curvature flow paths is disposed in the first region B1, it is possible to minimize the area of the dead zone, and obtain uniform thermoelectric performance in the entire region of the thermoelectric module.

More specifically, the third flow path portion 340 may be an inflection flow path including a region having a plurality of curvatures with different curvatures. In the embodiment of the present invention, the third flow path portion 340 may include first convex portions 343-1 to 343-3 convexly formed in the X2 direction arranged in the X2 direction and second convex portions 343-3 to 343-5 convexly formed in an opposite direction to the first convex portions 343-1 to 343-3, and the first convex portions 343-1 to 343-3 and the second convex portions 343-3 to 343-5 may overlap in the X1 direction. For example, the first convex portions 343-1 to 343-3 and the second convex portions 343-3 to 343-5 may be disposed in a region corresponding to a region between the fourth surface 1140 and the through holes S1 and S2, more specifically, between the fluid inlet 1142 and the fluid outlet 1144 between the fourth surface 1140 and the through holes S1 and S2. Accordingly, since the first fluid passes through the region that is close to the fourth surface 1140 and disposed between the fluid inlet 1142 and the fluid outlet 1144, it is possible to minimize the area of the dead zone, and obtain uniform thermoelectric performance in the entire region of the thermoelectric module.

At this time, the third flow path portion 340 may include a first zone 341 disposed on the first through hole S1, a second zone 341 disposed on the second through hole S2, and a third zone 343 configured to connect the first zone 341 and the second zone 342 in the relationship with the first through hole S1 and the second through hole S2 disposed to be spaced apart from each other. At this time, in the first zone 341, a 1-1st sub-zone 341-1 extending in the X1 direction X1 from the fourth surface 1140 toward the sixth surface 1160, a 1-2nd sub-zone 341-2 extending in the X2 direction parallel to the fourth surface 1140, and a 1-3rd sub-zone 341-3 extending in the X2 direction toward the X2 direction that is the opposite direction to the X1 direction may be sequentially connected. In particular, according to the 1-3rd sub-zone 341-1, the fluid introduced from the fluid inlet 1142 and moving down in the X1 direction along the 1-1st sub-zone 341-1 may flow toward the fourth surface 1140 again, thereby minimizing the area of the dead zone between the fluid inlet 1142 and the fluid outlet 1144.

In addition, the second zone 342 may be disposed to surround the second through hole S2. For example, in the second zone 342, a 2-1st sub-zone 342-1 extending in the X3 direction from the side of the second through hole S2, a 2-2nd sub-zone 342-2 extending in the X2 direction, and a 2-3rd sub-zone 342-3 extending in the X2 direction toward the X1 direction may be sequentially connected.

In addition, in the third zone 343, a 3-1st sub-zone 343-1 disposed between the first zone 341 and the second zone 342, and extending in the X2 direction from the 1-3rd sub-zone 341-3, a 3-2nd sub-zone 343-2 extending in the X1 direction, a 3-3rd sub-zone 343-3 extending in the X4 direction that is the opposite direction to the X2 direction, a 3-4th sub-zone 343-4 extending in the X1 direction, and a 3-5th sub-zone 343-5 extending in the X2 direction up to the 2-1st sub-zone 342-1 may be sequentially connected. At this time, the third zone 343 may be the above-described first convex portions 343-1 to 343-3 and second convex portions 343-3 to 343-5.

When the first to third zones 341, 342, and 343 are disposed as described above, the flow path through which the first fluid passes between the fluid inlet 1142 and the fluid outlet 1144 may increase, thereby minimizing the area of the dead zone. Meanwhile, the flow path according to the embodiment of the present invention may further include the fourth flow path portion 350 in which a predetermined pattern is repeated. The fourth flow path portion 350 may include a plurality of curvature flow paths in which a plurality of curvature portions with the same curvature are periodically disposed, and may be referred to as an uneven portion because it has an uneven shape. The fourth flow path portion 350 may have a shape in which a concave portion 351 concavely formed in the X1 direction and a convex portion 352 convexly formed in the X1 direction are alternately arranged.

In other words, the fourth flow path portion 350 may be disposed to alternately direct the X1 direction and the X3 direction and extend in the X2 direction.

Accordingly, since the length of the flow path per unit area may increase compared to a case in which the fourth flow path portion 350 is disposed in a straight shape parallel to the plurality of flow paths 320-1, ..., and 320-*m*, it is possible to enhance the cooling performance of the low temperature part of the thermoelectric module.

At this time, the fourth flow path portion 350 may be disposed between one second flow path portion 320-1 and another second flow path portion 320-2 that are spaced apart from each other in the X1 direction and disposed straightly. In addition, the fourth flow path portion 350 may be disposed in the second region B2 of the cooling unit 1100. In other words, the plurality of through holes S1 and S2 may be disposed between the fourth flow path portion 350 and the fourth surface 1140 on which the fluid inlet 1142 and the fluid outlet 1144 are disposed, and the through holes S3 and S4 may be disposed between the fourth flow path portion 350 and the sixth surface 1160. Accordingly, when the flow path is configured only with the straight flow path portion and the bending portion of the cooling unit 1100, it is possible to extend the time for which the first fluid stays even in the middle region where it is difficult for the first fluid to reach, thereby enhancing the cooling performance of the low temperature part of the thermoelectric module.

In particular, one second flow path portion 320-1 may be disposed between the fourth flow path portion 350 and the third flow path portion 340. Accordingly, since the time for which the first fluid stays even in the middle region where it is difficult for the first fluid to reach may extend when the flow path is formed, the first fluid may uniformly circulate in the entire region in the cooling unit 1100, thereby enhancing the cooling performance of the low temperature part of the thermoelectric module.

Table 2 shows the simulation results of the temperature difference of the thermoelectric module when the flow path shape according to examples of FIGS. 15 to 18 is provided.

TABLE 2

| Example | Area (mm²) | Area reduction rate (%) | Volume (mm³) | Volume reduction rate (%) | Temperature (K) of high temperature part | Temperature (K) of low temperature part | Temperature difference (K) | Improvement rate (%) |
|---|---|---|---|---|---|---|---|---|
| Example 1 | 8,804 | 0 | 43,909 | 0 | 433 | 318 | 115 | 0 |
| Example 2 | 4,229 | 52 | 20,782 | 52.7 | 432 | 314 | 117 | 2.1 |
| Example 3 | 4,229 | 52 | 20,783 | 52.7 | 432 | 314 | 117 | 2.1 |
| Example 4 | 3,773 | 57 | 183,467 | 57.9 | 434 | 313 | 120 | 4.5 |

Referring to Table 2, Example 1 has the shape of the fluid receiving part shown in FIG. 15, Example 2 has the shape of the flow path shown in FIG. 16, Example 3 has the shape of the flow path shown in FIG. 17, and Example 4 has the shape of the flow path shown in FIG. 18. It can be seen that in Examples 2 to 4 compared to Example 1, the temperature difference of the thermoelectric module was improved even when the area and volume of the flow path were reduced. In particular, it can be seen that in Example 4 compared to Examples 2 and 3, the temperature difference of the thermoelectric module was further improved even when the area and volume of the flow path were further reduced. This is because the first fluid circulates in a spiral shape within one region A1 of the cooling unit 1100, and the dead zone where the first fluid does not reach is minimized.

The power generation system may generate power through heat sources generated from ships, vehicles, power plants, geothermal heat, and the like, and may arrange a plurality of power generation apparatuses to efficiently converge the heat source. Accordingly, the heat source is uniformly injected into the plurality of power generation apparatuses through the plurality of branch units to uniformize the heat applied to the heat sink, thereby preventing bending of the heat sink, and improving the reliability of the power generation module. In addition, by controlling the horizontal distance between the branch unit and the guide plate to improve power generation efficiency, it is possible to improve the fuel efficiency of the transportation apparatus such as ships or vehicles. Accordingly, in the shipping and transportation industries, it is possible to reduce costs such as transportation and maintenance costs and create eco-friendly industrial environments, and when applied to manufacturing such as steel mills, it is possible to reduce maintenance costs or the like.

While the above has been described with reference to the exemplary embodiments of the present invention, those skilled in the art will understand that the present invention may be variously modified and changed without departing from the spirit and scope of the present invention described in the appended claims.

The invention claimed is:

1. A power generation apparatus, comprising:
a cooling unit;
a thermoelectric module including a thermoelectric element disposed on one surface of the cooling unit and a heat sink disposed on the thermoelectric element;
a guide plate disposed to face the thermoelectric module; and
a branch unit disposed on another surface perpendicular to the one surface of the cooling unit,
wherein the heat sink includes a plurality of heat dissipation fins spaced apart from each other, and
wherein a ratio of a shortest horizontal distance between the heat sink and the guide plate to a shortest horizontal distance between the branch unit and the guide plate ranges from 0.0625 to 0.25.

2. The power generation apparatus of claim 1, wherein the cooling unit is a duct through which a first fluid passes, and the branch unit branches a second fluid having a temperature higher than that of the first fluid, and
wherein the second fluid passes between the thermoelectric module and the guide plate.

3. The power generation apparatus of claim 1, wherein the ratio of the shortest horizontal distance between the heat sink and the guide plate to the shortest horizontal distance between the branch unit and the guide plate ranges from 0.0625 to 0.167.

4. The power generation apparatus of claim 1, wherein the shortest horizontal distance between the heat sink and the guide plate ranges from 1 to 3 mm.

5. The power generation apparatus of claim 2, wherein the thermoelectric module includes a first thermoelectric module disposed on a first surface of the duct and a second thermoelectric module disposed on a second surface of the duct facing the first surface,
wherein the guide plate includes a first guide plate disposed to face the first thermoelectric module and a second guide plate disposed to face the second thermoelectric module, and
wherein the second fluid is branched between the first thermoelectric module and the first guide plate and between the second thermoelectric module and the second guide plate by the branch unit.

6. The power generation apparatus of claim 5, wherein the branch unit is disposed on a third surface between the first surface and the second surface of the duct, and disposed to be inclined with respect to the first surface.

7. The power generation apparatus of claim 6, wherein the third surface is perpendicular to the first surface.

8. The power generation apparatus of claim 6, further comprising a separation member configured to separate the duct and the guide plate by a predetermined interval.

9. The power generation apparatus of claim 8, wherein the separation member includes a first region disposed between the first surface and the second surface of the duct, and disposed on a fourth surface perpendicular to the third surface, a second region extending from the first region toward the first surface, and a third region extending from the first region toward the second surface, and
wherein a first face of the second region is disposed on the first surface, a second face of the second region is disposed on the first guide plate, a first face of the third region is disposed on the second surface, and a second face of the third region is disposed on the second guide plate.

10. The power generation apparatus of claim 8, wherein the separation member comes into contact with the duct and the guide plate.

11. The power generation apparatus of claim 8, wherein the separation member includes a heat insulating material.

12. The power generation apparatus of claim 9, wherein the fourth surface is a surface disposed in a direction into which the first fluid is introduced.

13. The power generation apparatus of claim 1, wherein the shortest horizontal distance between the branch unit and the guide plate is 6.5 mm to 20 mm.

14. The power generation apparatus of claim 5, wherein each of the first and second guide plates extends to first and second fluid collection plates, and first and second fluid diffusion plates.

15. The power generation apparatus of claim 14, wherein the first and second guide plates are disposed symmetrically to each other, the first and second fluid collection plates are disposed symmetrically to each other, and the first and second fluid diffusion plates are disposed symmetrically to each other.

16. The power generation apparatus of claim 15, wherein a distance between the first and second guide plates is constant.

17. The power generation apparatus of claim 16, wherein a distance between the first and second fluid collection plates increases with increasing distance from the first and second guide plates, and a distance between the first and second fluid diffusion plates increases with increasing distance from the first and second guide plates.

18. The power generation apparatus of claim 17, wherein the distance between the first and second fluid collection plates and the distance between the first and second fluid diffusion plates are greater than the distance between the first and second guide plates.

19. The power generation apparatus of claim 5, wherein a width between the first thermoelectric module and the second thermoelectric module is less than a width of the branch unit.

* * * * *